United States Patent
Kothari et al.

(10) Patent No.: US 8,797,628 B2
(45) Date of Patent: Aug. 5, 2014

(54) DISPLAY WITH INTEGRATED PHOTOVOLTAIC DEVICE

(75) Inventors: Manish Kothari, Cupertino, CA (US); Kasra Khazeni, San Jose, CA (US)

(73) Assignee: Qualcomm Memstechnologies, Inc., San Diego, CA (US)

( * ) Notice: Subject to any disclaimer, the term of this patent is extended or adjusted under 35 U.S.C. 154(b) by 973 days.

(21) Appl. No.: 12/842,845

(22) Filed: Jul. 23, 2010

(65) Prior Publication Data

US 2010/0284055 A1    Nov. 11, 2010

Related U.S. Application Data

(63) Continuation of application No. 12/254,766, filed on Oct. 20, 2008, now Pat. No. 8,130,440.

(60) Provisional application No. 60/999,566, filed on Oct. 19, 2007.

(51) Int. Cl.
  G02B 26/00 (2006.01)
  H02N 6/00 (2006.01)
  G02B 26/08 (2006.01)

(52) U.S. Cl.
  CPC .................................. *G02B 26/0841* (2013.01)
  USPC .......................................... 359/290; 136/246

(58) Field of Classification Search
  USPC .................. 359/290, 291, 294, 318; 349/116; 136/246
  See application file for complete search history.

(56) References Cited

U.S. PATENT DOCUMENTS

| | | | |
|---|---|---|---|
| 2,534,846 | A | 12/1950 | Ambrose et al. |
| 2,590,906 | A | 4/1952 | Tripp |
| 2,677,714 | A | 5/1954 | Auwarter |
| 2,700,919 | A | 2/1955 | Boone |
| 3,247,392 | A | 4/1966 | Thelen |
| 3,679,313 | A | 7/1972 | Rosenberg |
| 3,728,030 | A | 4/1973 | Hawes |
| 3,886,310 | A | 5/1975 | Guldberg et al. |
| 3,955,190 | A | 5/1976 | Teraishi |
| 3,955,880 | A | 5/1976 | Lierke |
| 4,099,854 | A | 7/1978 | Decker et al. |
| 4,116,718 | A | 9/1978 | Yerkes et al. |
| 4,200,472 | A | 4/1980 | Chappell et al. |

(Continued)

FOREIGN PATENT DOCUMENTS

| DE | 10329917 | 2/2005 |
|---|---|---|
| DE | 10 2006 039 071 | 2/2008 |

(Continued)

OTHER PUBLICATIONS

Extended European Search Report dated Jun. 19, 2009 in App. No. 08153685.6.

(Continued)

*Primary Examiner* — William Choi
(74) *Attorney, Agent, or Firm* — Knobbe, Martens, Olson & Bear LLP

(57) ABSTRACT

A display with a photovoltaic (PV) cells integrated as the front side and/or back side of the display is disclosed. Ambient light may reach a PV cell situated behind a display through fully or partially transmissive features within the display. Display-generated light may also reach a PV cell behind a display. A transmissive PV material situated in front of a display may collect both ambient light as well as display-generated light.

16 Claims, 14 Drawing Sheets

(56) References Cited

U.S. PATENT DOCUMENTS

| | | |
|---|---|---|
| 4,282,862 A | 8/1981 | Soleau |
| 4,357,486 A | 11/1982 | Blieden et al. |
| 4,377,324 A | 3/1983 | Durand et al. |
| 4,400,577 A | 8/1983 | Spear |
| 4,403,248 A | 9/1983 | Te Velde |
| 4,421,381 A | 12/1983 | Ueda et al. |
| 4,441,789 A | 4/1984 | Pohlack |
| 4,441,791 A | 4/1984 | Hornbeck |
| 4,459,182 A | 7/1984 | te Velde |
| 4,463,336 A | 7/1984 | Black et al. |
| 4,497,974 A | 2/1985 | Deckman et al. |
| 4,498,953 A | 2/1985 | Cook et al. |
| 4,519,676 A | 5/1985 | te Velde |
| 4,560,435 A | 12/1985 | Brown et al. |
| 4,633,031 A | 12/1986 | Todorof |
| 4,655,554 A | 4/1987 | Armitage |
| 4,688,068 A | 8/1987 | Chaffin et al. |
| 4,705,361 A | 11/1987 | Frazier et al. |
| 4,779,959 A | 10/1988 | Saunders |
| 4,786,128 A | 11/1988 | Birnbach |
| 4,822,993 A | 4/1989 | Dillon et al. |
| 4,859,060 A | 8/1989 | Katagiri et al. |
| 4,925,259 A | 5/1990 | Emmett |
| 4,954,789 A | 9/1990 | Sampsell |
| 4,956,619 A | 9/1990 | Hornbeck |
| 4,973,131 A | 11/1990 | Carnes |
| 4,982,184 A | 1/1991 | Kirkwood |
| 5,022,745 A | 6/1991 | Zayhowski et al. |
| 5,028,939 A | 7/1991 | Hornbeck et al. |
| 5,062,689 A | 11/1991 | Koehler |
| 5,091,983 A | 2/1992 | Lukosz |
| 5,096,279 A | 3/1992 | Hornbeck et al. |
| 5,110,370 A | 5/1992 | Vogeli et al. |
| 5,170,283 A | 12/1992 | O'Brien et al. |
| 5,261,970 A | 11/1993 | Landis et al. |
| 5,315,370 A | 5/1994 | Bulow |
| 5,356,488 A | 10/1994 | Hezel |
| 5,381,232 A | 1/1995 | van Wijk |
| 5,401,983 A | 3/1995 | Jokerst et al. |
| 5,452,138 A | 9/1995 | Mignardi et al. |
| 5,471,341 A | 11/1995 | Warde et al. |
| 5,500,761 A | 3/1996 | Goossen et al. |
| 5,526,172 A | 6/1996 | Kanack |
| 5,544,268 A | 8/1996 | Bischel et al. |
| 5,550,373 A | 8/1996 | Cole et al. |
| 5,559,358 A | 9/1996 | Burns et al. |
| 5,561,523 A | 10/1996 | Blomberg et al. |
| 5,578,140 A | 11/1996 | Yogev et al. |
| 5,597,736 A | 1/1997 | Sampsell |
| 5,600,383 A | 2/1997 | Hornbeck |
| 5,636,052 A | 6/1997 | Arney et al. |
| 5,646,729 A | 7/1997 | Koskinen et al. |
| 5,646,768 A | 7/1997 | Kaeriyama |
| 5,647,036 A | 7/1997 | Deacon et al. |
| 5,661,592 A | 8/1997 | Bornstein et al. |
| 5,665,997 A | 9/1997 | Weaver et al. |
| 5,699,181 A | 12/1997 | Choi |
| 5,710,656 A | 1/1998 | Goossen |
| 5,719,068 A | 2/1998 | Suzawa et al. |
| 5,720,827 A | 2/1998 | Simmons |
| 5,726,805 A | 3/1998 | Kaushik et al. |
| 5,734,177 A | 3/1998 | Sakamoto |
| 5,745,281 A | 4/1998 | Yi et al. |
| 5,771,116 A | 6/1998 | Miller et al. |
| 5,782,995 A | 7/1998 | Nanya et al. |
| 5,786,927 A | 7/1998 | Greywall |
| 5,808,781 A | 9/1998 | Arney et al. |
| 5,818,095 A | 10/1998 | Sampsell |
| 5,825,528 A | 10/1998 | Goossen |
| 5,835,255 A | 11/1998 | Miles |
| 5,838,484 A | 11/1998 | Goossen |
| 5,867,302 A | 2/1999 | Fleming |
| 5,870,221 A | 2/1999 | Goossen |
| 5,886,688 A | 3/1999 | Fifield et al. |
| 5,907,426 A | 5/1999 | Kato et al. |
| 5,914,804 A | 6/1999 | Goossen |
| 5,920,418 A | 7/1999 | Shiono et al. |
| 5,961,848 A | 10/1999 | Jacquet et al. |
| 5,963,282 A | 10/1999 | Battersby |
| 5,986,796 A | 11/1999 | Miles |
| 6,008,449 A | 12/1999 | Cole |
| 6,021,007 A | 2/2000 | Murtha |
| 6,028,689 A | 2/2000 | Michalicek et al. |
| 6,031,653 A | 2/2000 | Wang |
| 6,040,937 A | 3/2000 | Miles |
| 6,046,659 A | 4/2000 | Loo et al. |
| 6,055,090 A | 4/2000 | Miles |
| 6,094,285 A | 7/2000 | Wickham et al. |
| 6,097,145 A | 8/2000 | Kastalsky et al. |
| 6,100,861 A | 8/2000 | Cohen et al. |
| 6,123,431 A | 9/2000 | Teragaki et al. |
| 6,124,851 A | 9/2000 | Jacobson |
| 6,242,932 B1 | 6/2001 | Hembree |
| 6,262,697 B1 | 7/2001 | Stephenson |
| 6,300,558 B1 | 10/2001 | Takamoto et al. |
| 6,301,000 B1 | 10/2001 | Johnson |
| 6,323,415 B1 | 11/2001 | Uematsu et al. |
| 6,323,923 B1 | 11/2001 | Hoshino et al. |
| 6,323,987 B1 | 11/2001 | Rinaudo et al. |
| 6,327,071 B1 | 12/2001 | Kimura |
| 6,335,235 B1 | 1/2002 | Bhakta et al. |
| 6,351,329 B1 | 2/2002 | Greywall |
| 6,356,378 B1 | 3/2002 | Huibers |
| 6,377,233 B2 | 4/2002 | Colgan et al. |
| 6,381,022 B1 | 4/2002 | Zavracky |
| 6,384,952 B1 | 5/2002 | Clark et al. |
| 6,400,738 B1 | 6/2002 | Tucker et al. |
| 6,433,847 B1 | 8/2002 | Minoura |
| 6,433,917 B1 | 8/2002 | Mei et al. |
| 6,438,282 B1 | 8/2002 | Takeda et al. |
| 6,452,712 B2 | 9/2002 | Atobe et al. |
| 6,466,354 B1 | 10/2002 | Gudeman |
| 6,518,944 B1 | 2/2003 | Doane et al. |
| 6,519,073 B1 | 2/2003 | Goossen |
| 6,522,794 B1 | 2/2003 | Bischel et al. |
| 6,556,338 B2 | 4/2003 | Han et al. |
| 6,574,033 B1 | 6/2003 | Chui et al. |
| 6,597,490 B2 | 7/2003 | Tayebati |
| 6,608,268 B1 | 8/2003 | Goldsmith |
| 6,630,786 B2 | 10/2003 | Cummings et al. |
| 6,632,698 B2 | 10/2003 | Ives |
| 6,650,455 B2 | 11/2003 | Miles |
| 6,657,832 B2 | 12/2003 | Williams et al. |
| 6,661,561 B2 | 12/2003 | Fitzpatrick et al. |
| 6,674,562 B1 | 1/2004 | Miles et al. |
| 6,698,295 B1 | 3/2004 | Sherrer |
| 6,710,908 B2 | 3/2004 | Miles et al. |
| 6,738,194 B1 | 5/2004 | Ramirez et al. |
| 6,741,377 B2 | 5/2004 | Miles |
| 6,747,800 B1 | 6/2004 | Lin |
| 6,768,555 B2 | 7/2004 | Chen et al. |
| 6,794,119 B2 | 9/2004 | Miles |
| 6,813,059 B2 | 11/2004 | Hunter et al. |
| 6,822,157 B2 | 11/2004 | Fujioka |
| 6,822,798 B2 | 11/2004 | Wu et al. |
| 6,836,366 B1 | 12/2004 | Flanders et al. |
| 6,841,081 B2 | 1/2005 | Chang et al. |
| 6,844,959 B2 | 1/2005 | Huibers et al. |
| 6,849,471 B2 | 2/2005 | Patel et al. |
| 6,861,277 B1 | 3/2005 | Monroe et al. |
| 6,862,127 B1 | 3/2005 | Ishii |
| 6,867,896 B2 | 3/2005 | Miles |
| 6,870,654 B2 | 3/2005 | Lin et al. |
| 6,882,458 B2 | 4/2005 | Lin et al. |
| 6,882,461 B1 | 4/2005 | Tsai et al. |
| 6,891,869 B2 | 5/2005 | Augusto |
| 6,912,022 B2 | 6/2005 | Lin et al. |
| 6,913,942 B2 | 7/2005 | Patel et al. |
| 6,927,387 B2 | 8/2005 | Viktorovitch |
| 6,940,630 B2 | 9/2005 | Xie |
| 6,947,200 B2 | 9/2005 | Huibers |
| 6,952,303 B2 | 10/2005 | Lin et al. |
| 6,958,847 B2 | 10/2005 | Lin |
| 6,960,305 B2 | 11/2005 | Doan et al. |

(56) References Cited

U.S. PATENT DOCUMENTS

| | | |
|---|---|---|
| 6,970,155 B2 | 11/2005 | Cabrera |
| 6,980,350 B2 | 12/2005 | Hung et al. |
| 6,982,820 B2 | 1/2006 | Tsai |
| 6,999,236 B2 | 2/2006 | Lin et al. |
| 7,002,726 B2 | 2/2006 | Patel et al. |
| 7,006,272 B2 | 2/2006 | Tsai |
| 7,009,754 B2 | 3/2006 | Huibers |
| 7,027,204 B2 | 4/2006 | Trisnadi et al. |
| 7,034,981 B2 | 4/2006 | Makigaki |
| 7,046,422 B2 | 5/2006 | Kimura et al. |
| 7,072,093 B2 | 7/2006 | Piehl et al. |
| 7,113,339 B2 | 9/2006 | Taguchi et al. |
| 7,119,945 B2 | 10/2006 | Kothari et al. |
| 7,123,216 B1 | 10/2006 | Miles |
| 7,126,738 B2 | 10/2006 | Miles |
| 7,130,104 B2 | 10/2006 | Cummings |
| 7,184,195 B2 | 2/2007 | Yang |
| 7,184,202 B2 | 2/2007 | Miles et al. |
| 7,187,489 B2 | 3/2007 | Miles |
| 7,198,973 B2 | 4/2007 | Lin et al. |
| 7,218,438 B2 | 5/2007 | Przybyla et al. |
| 7,221,495 B2 | 5/2007 | Miles et al. |
| 7,236,284 B2 | 6/2007 | Miles |
| 7,245,285 B2 | 7/2007 | Yeh et al. |
| 7,274,118 B2 | 9/2007 | Jenson et al. |
| 7,289,259 B2 | 10/2007 | Chui et al. |
| 7,302,157 B2 | 11/2007 | Chui |
| 7,321,456 B2 | 1/2008 | Cummings |
| 7,321,457 B2 | 1/2008 | Heald |
| 7,327,510 B2 | 2/2008 | Cummings et al. |
| 7,372,613 B2 | 5/2008 | Chui et al. |
| 7,372,619 B2 | 5/2008 | Miles |
| 7,385,744 B2 | 6/2008 | Kogut et al. |
| 7,385,748 B2 | 6/2008 | Miles |
| 7,385,762 B2 | 6/2008 | Cummings |
| 7,400,488 B2 | 7/2008 | Lynch et al. |
| 7,405,852 B2 | 7/2008 | Hasgood, IV et al. |
| 7,417,746 B2 | 8/2008 | Lin et al. |
| 7,420,725 B2 | 9/2008 | Kothari |
| 7,436,573 B2 | 10/2008 | Doan et al. |
| 7,459,402 B2 | 12/2008 | Doan et al. |
| 7,460,291 B2 | 12/2008 | Sampsell et al. |
| 7,460,292 B2 | 12/2008 | Chou |
| 7,463,421 B2 | 12/2008 | Miles |
| 7,476,327 B2 | 1/2009 | Tung et al. |
| 7,477,440 B1 | 1/2009 | Huang |
| 7,492,503 B2 | 2/2009 | Chui |
| 7,508,566 B2 | 3/2009 | Feenstra et al. |
| 7,515,327 B2 | 4/2009 | Cummings |
| 7,527,995 B2 | 5/2009 | Sampsell |
| 7,532,377 B2 | 5/2009 | Miles |
| 7,535,621 B2 | 5/2009 | Chiang |
| 7,542,198 B2 | 6/2009 | Kothari |
| 7,550,794 B2 | 6/2009 | Miles et al. |
| 7,550,810 B2 | 6/2009 | Mignard et al. |
| 7,554,711 B2 | 6/2009 | Miles |
| 7,554,714 B2 | 6/2009 | Chui et al. |
| 7,561,321 B2 | 7/2009 | Heald |
| 7,564,612 B2 | 7/2009 | Chui |
| 7,566,664 B2 | 7/2009 | Yan et al. |
| 7,567,373 B2 | 7/2009 | Chui et al. |
| 7,569,488 B2 | 8/2009 | Rafanan |
| 7,595,926 B2 | 9/2009 | Sasagawa et al. |
| 7,605,969 B2 | 10/2009 | Miles |
| 7,612,932 B2 | 11/2009 | Chui et al. |
| 7,612,933 B2 | 11/2009 | Djordjev |
| 7,629,197 B2 | 12/2009 | Luo et al. |
| 7,630,119 B2 | 12/2009 | Tung et al. |
| 7,630,121 B2 | 12/2009 | Endisch et al. |
| 7,643,199 B2 | 1/2010 | Lan |
| 7,643,202 B2 | 1/2010 | Sasagawa |
| 7,649,671 B2 | 1/2010 | Kothari et al. |
| 7,663,794 B2 | 2/2010 | Cummings |
| 7,668,415 B2 | 2/2010 | Tyger |
| 7,672,035 B2 | 3/2010 | Sampsell et al. |
| 7,692,844 B2 | 4/2010 | Miles |
| 7,701,029 B2 | 4/2010 | Mabuchi |
| 7,704,772 B2 | 4/2010 | Tung et al. |
| 7,710,632 B2 | 5/2010 | Cummings |
| 7,715,079 B2 | 5/2010 | Kogut et al. |
| 7,715,085 B2 | 5/2010 | Sasagawa |
| 7,719,500 B2 | 5/2010 | Chui |
| 7,738,157 B2 | 6/2010 | Miles |
| 7,741,144 B2 | 6/2010 | Choi et al. |
| 7,742,220 B2 | 6/2010 | Kogut et al. |
| 7,773,286 B2 | 8/2010 | Mignard |
| 7,782,517 B2 | 8/2010 | Griffiths et al. |
| 7,782,523 B2 | 8/2010 | Ishii |
| 7,787,173 B2 | 8/2010 | Chui |
| 7,804,023 B2 | 9/2010 | Wong et al. |
| 7,813,029 B2 | 10/2010 | Kothari et al. |
| 7,852,544 B2 | 12/2010 | Sampsell et al. |
| 7,898,722 B2 | 3/2011 | Miles |
| 8,058,549 B2 | 11/2011 | Kothari |
| 8,130,440 B2 | 3/2012 | Kothari et al. |
| 8,169,686 B2 | 5/2012 | Kothari et al. |
| 2001/0003487 A1 | 6/2001 | Miles |
| 2001/0006066 A1 | 7/2001 | Cherney et al. |
| 2001/0028503 A1 | 10/2001 | Flanders et al. |
| 2001/0043171 A1 | 11/2001 | Van Gorkom et al. |
| 2002/0024711 A1 | 2/2002 | Miles |
| 2002/0050286 A1 | 5/2002 | Kubota |
| 2002/0070931 A1 | 6/2002 | Ishikawa |
| 2002/0075555 A1 | 6/2002 | Miles |
| 2002/0126364 A1 | 9/2002 | Miles |
| 2002/0146200 A1 | 10/2002 | Kudrle et al. |
| 2002/0149834 A1 | 10/2002 | Mei et al. |
| 2002/0154422 A1 | 10/2002 | Sniegowski et al. |
| 2002/0197761 A1 | 12/2002 | Patel et al. |
| 2003/0001813 A1 | 1/2003 | Sekiguchi |
| 2003/0006730 A1 | 1/2003 | Tachibana |
| 2003/0011864 A1 | 1/2003 | Flanders |
| 2003/0016428 A1 | 1/2003 | Kato et al. |
| 2003/0035196 A1 | 2/2003 | Walker |
| 2003/0043157 A1 | 3/2003 | Miles |
| 2003/0053078 A1 | 3/2003 | Missey et al. |
| 2003/0119221 A1 | 6/2003 | Cunningham et al. |
| 2003/0123125 A1 | 7/2003 | Little |
| 2003/0138669 A1 | 7/2003 | Kojima et al. |
| 2003/0173504 A1 | 9/2003 | Cole et al. |
| 2003/0202265 A1 | 10/2003 | Reboa et al. |
| 2003/0202266 A1 | 10/2003 | Ring et al. |
| 2003/0213514 A1 | 11/2003 | Ortabasi |
| 2004/0008396 A1 | 1/2004 | Stappaerts |
| 2004/0008438 A1 | 1/2004 | Sato |
| 2004/0027701 A1 | 2/2004 | Ishikawa |
| 2004/0043552 A1 | 3/2004 | Strumpell et al. |
| 2004/0066477 A1 | 4/2004 | Morimoto et al. |
| 2004/0075967 A1 | 4/2004 | Lynch et al. |
| 2004/0076802 A1 | 4/2004 | Tompkin et al. |
| 2004/0080035 A1 | 4/2004 | Delapierre |
| 2004/0100594 A1 | 5/2004 | Huibers et al. |
| 2004/0100677 A1 | 5/2004 | Huibers et al. |
| 2004/0125281 A1 | 7/2004 | Lin |
| 2004/0147198 A1 | 7/2004 | Lin et al. |
| 2004/0175577 A1 | 9/2004 | Lin et al. |
| 2004/0188599 A1 | 9/2004 | Viktorovitch et al. |
| 2004/0200520 A1 | 10/2004 | Mulligan et al. |
| 2004/0207897 A1 | 10/2004 | Lin |
| 2004/0209195 A1 | 10/2004 | Lin |
| 2004/0217264 A1 | 11/2004 | Wood et al. |
| 2004/0217919 A1 | 11/2004 | Piehl et al. |
| 2004/0259010 A1 | 12/2004 | Kanbe |
| 2005/0002082 A1 | 1/2005 | Miles |
| 2005/0003667 A1 | 1/2005 | Lin et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0046922 A1 | 3/2005 | Lin et al. |
| 2005/0046948 A1 | 3/2005 | Lin |
| 2005/0068627 A1 | 3/2005 | Nakamura et al. |
| 2005/0078348 A1 | 4/2005 | Lin |
| 2005/0117190 A1 | 6/2005 | Iwauchi et al. |
| 2005/0117623 A1 | 6/2005 | Shchukin et al. |

(56) References Cited

U.S. PATENT DOCUMENTS

| | | |
|---|---|---|
| 2005/0128543 A1 | 6/2005 | Phillips et al. |
| 2005/0133761 A1 | 6/2005 | Thielemans |
| 2005/0168849 A1 | 8/2005 | Lin |
| 2005/0179378 A1 | 8/2005 | Oooka et al. |
| 2005/0195462 A1 | 9/2005 | Lin |
| 2005/0220394 A1 | 10/2005 | Yamamoto et al. |
| 2005/0225686 A1 | 10/2005 | Brummack et al. |
| 2005/0275930 A1 | 12/2005 | Patel et al. |
| 2006/0007517 A1 | 1/2006 | Tsai |
| 2006/0017379 A1 | 1/2006 | Su et al. |
| 2006/0017689 A1 | 1/2006 | Faase et al. |
| 2006/0038643 A1 | 2/2006 | Xu et al. |
| 2006/0065940 A1 | 3/2006 | Kothari |
| 2006/0066541 A1 | 3/2006 | Gally et al. |
| 2006/0066640 A1 | 3/2006 | Kothari et al. |
| 2006/0066641 A1 | 3/2006 | Gally et al. |
| 2006/0066783 A1 | 3/2006 | Sampsell |
| 2006/0066935 A1 | 3/2006 | Cummings et al. |
| 2006/0067633 A1 | 3/2006 | Gally et al. |
| 2006/0067642 A1 | 3/2006 | Tyger |
| 2006/0077155 A1 | 4/2006 | Chui et al. |
| 2006/0077156 A1 | 4/2006 | Chui et al. |
| 2006/0082588 A1 | 4/2006 | Mizuno et al. |
| 2006/0082863 A1 | 4/2006 | Piehl et al. |
| 2006/0130889 A1 | 6/2006 | Li et al. |
| 2006/0132927 A1 | 6/2006 | Yoon |
| 2006/0176487 A1 | 8/2006 | Cummings et al. |
| 2006/0180886 A1 | 8/2006 | Tsang |
| 2006/0201546 A1 | 9/2006 | Yokoyama |
| 2006/0220160 A1 | 10/2006 | Miles |
| 2006/0261330 A1 | 11/2006 | Miles |
| 2006/0262126 A1 | 11/2006 | Miles |
| 2006/0262562 A1 | 11/2006 | Fukasawa et al. |
| 2006/0274400 A1 | 12/2006 | Miles |
| 2007/0020948 A1 | 1/2007 | Piehl et al. |
| 2007/0031097 A1 | 2/2007 | Heikenfeld et al. |
| 2007/0077525 A1 | 4/2007 | Davis et al. |
| 2007/0086078 A1 | 4/2007 | Hagood et al. |
| 2007/0097694 A1 | 5/2007 | Faase et al. |
| 2007/0107776 A1 | 5/2007 | Li et al. |
| 2007/0113887 A1 | 5/2007 | Laih et al. |
| 2007/0121118 A1 | 5/2007 | Gally et al. |
| 2007/0125415 A1 | 6/2007 | Sachs |
| 2007/0132843 A1 | 6/2007 | Miles |
| 2007/0138608 A1 | 6/2007 | Ikehashi |
| 2007/0153860 A1 | 7/2007 | Chang-Hasnain et al. |
| 2007/0171418 A1 | 7/2007 | Nyhart |
| 2007/0177247 A1 | 8/2007 | Miles |
| 2007/0196040 A1 | 8/2007 | Wang et al. |
| 2007/0206267 A1 | 9/2007 | Tung et al. |
| 2007/0216987 A1 | 9/2007 | Hagood et al. |
| 2007/0221269 A1 | 9/2007 | Sakai et al. |
| 2007/0235072 A1 | 10/2007 | Bermel et al. |
| 2007/0247704 A1 | 10/2007 | Mignard |
| 2007/0253054 A1 | 11/2007 | Miles |
| 2007/0285761 A1 | 12/2007 | Zhong et al. |
| 2008/0002299 A1 | 1/2008 | Thurn |
| 2008/0013145 A1 | 1/2008 | Chui et al. |
| 2008/0030657 A1 | 2/2008 | Wu et al. |
| 2008/0037093 A1 | 2/2008 | Miles |
| 2008/0049168 A1 | 2/2008 | Kubota |
| 2008/0055706 A1 | 3/2008 | Chui et al. |
| 2008/0055707 A1 | 3/2008 | Kogut et al. |
| 2008/0068697 A1 | 3/2008 | Haluzak et al. |
| 2008/0080043 A1 | 4/2008 | Chui et al. |
| 2008/0088904 A1 | 4/2008 | Miles |
| 2008/0088910 A1 | 4/2008 | Miles |
| 2008/0088912 A1 | 4/2008 | Miles |
| 2008/0105298 A1 | 5/2008 | Lu et al. |
| 2008/0106782 A1 | 5/2008 | Miles |
| 2008/0110855 A1 | 5/2008 | Cummings |
| 2008/0180784 A1 | 7/2008 | Silverstein et al. |
| 2008/0186581 A1 | 8/2008 | Bita et al. |
| 2008/0218834 A1 | 9/2008 | Wang |
| 2008/0247028 A1 | 10/2008 | Chui et al. |
| 2008/0279498 A1 | 11/2008 | Sampsell et al. |
| 2008/0297880 A1 | 12/2008 | Steckl et al. |
| 2009/0021884 A1 | 1/2009 | Nakamura |
| 2009/0073534 A1 | 3/2009 | Lee et al. |
| 2009/0073540 A1 | 3/2009 | Kothari et al. |
| 2009/0078316 A1 | 3/2009 | Khazeni |
| 2009/0126777 A1 | 5/2009 | Khazeni et al. |
| 2009/0126792 A1 | 5/2009 | Gruhlke et al. |
| 2009/0151771 A1 | 6/2009 | Kothari et al. |
| 2009/0159123 A1 | 6/2009 | Kothari et al. |
| 2009/0199893 A1 | 8/2009 | Bita et al. |
| 2009/0199900 A1 | 8/2009 | Bita et al. |
| 2009/0201566 A1 | 8/2009 | Kothari |
| 2009/0211885 A1 | 8/2009 | Steeneken et al. |
| 2009/0213450 A1 | 8/2009 | Sampsell |
| 2009/0213451 A1 | 8/2009 | Tung et al. |
| 2009/0219604 A1 | 9/2009 | Miles |
| 2009/0229664 A1 | 9/2009 | Appadurai |
| 2009/0242024 A1 | 10/2009 | Kothari et al. |
| 2009/0251761 A1 | 10/2009 | Khazeni et al. |
| 2009/0255569 A1 | 10/2009 | Sampsell et al. |
| 2009/0256218 A1 | 10/2009 | Mignard et al. |
| 2009/0257105 A1 | 10/2009 | Xu et al. |
| 2009/0273823 A1 | 11/2009 | Tung et al. |
| 2009/0273824 A1 | 11/2009 | Sasagawa |
| 2009/0279162 A1 | 11/2009 | Chui |
| 2009/0293955 A1 | 12/2009 | Kothari et al. |
| 2009/0293995 A1 | 12/2009 | Tanaka et al. |
| 2010/0039370 A1 | 2/2010 | Miles |
| 2010/0051089 A1 | 3/2010 | Khazeni et al. |
| 2010/0055824 A1 | 3/2010 | Lin et al. |
| 2010/0059097 A1 | 3/2010 | Mcdonald et al. |
| 2010/0079711 A1 | 4/2010 | Tanaka |
| 2010/0080890 A1 | 4/2010 | Tung et al. |
| 2010/0085626 A1 | 4/2010 | Tung et al. |
| 2010/0096006 A1 | 4/2010 | Griffiths et al. |
| 2010/0096011 A1 | 4/2010 | Griffiths et al. |
| 2010/0118382 A1 | 5/2010 | Kothari et al. |
| 2010/0180946 A1 | 7/2010 | Gruhlke et al. |
| 2010/0214642 A1 | 8/2010 | Miles |
| 2010/0236624 A1 | 9/2010 | Khazeni et al. |
| 2010/0309572 A1 | 12/2010 | Mignard |
| 2011/0019380 A1 | 1/2011 | Miles |
| 2011/0026095 A1 | 2/2011 | Kothari et al. |
| 2011/0026096 A1 | 2/2011 | Miles |
| 2011/0038027 A1 | 2/2011 | Miles |
| 2011/0044496 A1 | 2/2011 | Chui et al. |
| 2011/0069371 A1 | 3/2011 | Kothari et al. |
| 2011/0080632 A1 | 4/2011 | Miles |
| 2011/0116156 A1 | 5/2011 | Kothari |
| 2012/0194896 A1 | 8/2012 | Kothari et al. |

FOREIGN PATENT DOCUMENTS

| | | |
|---|---|---|
| EP | 0 223 136 | 5/1987 |
| EP | 0622856 A1 | 11/1994 |
| EP | 0668490 A2 | 8/1995 |
| EP | 0695959 A1 | 2/1996 |
| EP | 0 843 364 | 5/1998 |
| EP | 0879991 A2 | 11/1998 |
| EP | 0969306 A1 | 1/2000 |
| EP | 0986077 A2 | 3/2000 |
| EP | 1122577 A2 | 8/2001 |
| EP | 1205782 A2 | 5/2002 |
| EP | 1227346 A2 | 7/2002 |
| EP | 1 275 997 | 1/2003 |
| EP | 1 369 932 | 12/2003 |
| EP | 1 403 212 | 3/2004 |
| EP | 1473581 A2 | 11/2004 |
| EP | 1 640 958 | 3/2006 |
| EP | 1640317 A2 | 3/2006 |
| EP | 1 670 065 | 6/2006 |
| EP | 1691429 A2 | 8/2006 |
| EP | 1928028 A1 | 6/2008 |
| EP | 2 051 124 | 4/2009 |
| GB | 2 396 436 | 6/2004 |
| JP | 56 088111 | 7/1981 |
| JP | 60 147718 | 8/1985 |
| JP | 2068513 A | 3/1990 |

(56) References Cited

FOREIGN PATENT DOCUMENTS

| JP | 02-151079 | 6/1990 |
|---|---|---|
| JP | 04 190323 | 7/1992 |
| JP | 04 238321 | 8/1992 |
| JP | 05049238 | 2/1993 |
| JP | 05281479 | 10/1993 |
| JP | 8018990 A | 1/1996 |
| JP | 8-051230 | 2/1996 |
| JP | 8046228 A | 2/1996 |
| JP | 08 094992 | 4/1996 |
| JP | 09 068722 | 3/1997 |
| JP | 09-281917 | 10/1997 |
| JP | 9307132 A | 11/1997 |
| JP | 10308525 A | 11/1998 |
| JP | 10-325948 | 12/1998 |
| JP | 11 211999 | 8/1999 |
| JP | 11 295725 | 10/1999 |
| JP | 11-295726 | 10/1999 |
| JP | 11-296636 | 10/1999 |
| JP | 2000147262 A | 5/2000 |
| JP | 2000 221497 | 8/2000 |
| JP | 2001221913 A | 8/2001 |
| JP | 2001249283 A | 9/2001 |
| JP | 2001-345458 | 12/2001 |
| JP | 2002062490 A | 2/2002 |
| JP | 2002174780 | 6/2002 |
| JP | 2002221678 A | 8/2002 |
| JP | 2002-251147 | 9/2002 |
| JP | 2002287047 A | 10/2002 |
| JP | 2003086233 A | 3/2003 |
| JP | 2003177336 A | 6/2003 |
| JP | 2003340795 A | 12/2003 |
| JP | 2004012642 A | 1/2004 |
| JP | 2004212638 A | 7/2004 |
| JP | 2004212680 A | 7/2004 |
| JP | 2005-266007 | 9/2005 |
| JP | 2005266007 A * | 9/2005 |
| JP | 2005 292521 | 10/2005 |
| JP | 2005279831 A | 10/2005 |
| JP | 05-308871 | 11/2005 |
| JP | 2006-065360 | 3/2006 |
| JP | 2006 099101 | 4/2006 |
| JP | 2006099101 A | 4/2006 |
| JP | 2006 163362 | 6/2006 |
| JP | 2007027150 A | 2/2007 |
| JP | 2007-334132 | 12/2007 |
| KR | 2003-0081662 | 10/2003 |
| WO | WO 94/28452 | 12/1994 |
| WO | WO 95/15582 | 6/1995 |
| WO | WO 97/44707 | 11/1997 |
| WO | WO-9814804 A1 | 4/1998 |
| WO | WO 99/04296 | 1/1999 |
| WO | WO 00/11502 | 3/2000 |
| WO | WO-0224570 A1 | 3/2002 |
| WO | WO 02/27805 | 4/2002 |
| WO | WO-02086582 A1 | 10/2002 |
| WO | WO-03105198 A1 | 12/2003 |
| WO | WO 2004/114418 | 12/2004 |
| WO | WO 2006/034377 | 3/2006 |
| WO | WO-2006035698 A1 | 4/2006 |
| WO | WO 2006/137337 | 12/2006 |
| WO | WO-2007036422 | 4/2007 |
| WO | WO-2007045875 A1 | 4/2007 |
| WO | WO-2007053438 A1 | 5/2007 |
| WO | WO 2007/073203 | 6/2007 |
| WO | WO-2007072998 A1 | 6/2007 |
| WO | WO-2008062363 A2 | 5/2008 |
| WO | WO 2008/067024 | 6/2008 |

OTHER PUBLICATIONS

International Preliminary Report on Patentability dated Jan. 29, 2010, Application No. PCT/US2008/080222.
International Search Report and Written Opinion dated Jun. 19, 2009, Application No. PCT/US2008/078498.
International Search Report and Written Opinion dated Jun. 19, 2009, Application No. PCT/US2008/080222.
International Search Report and Written Opinion dated Jun. 19, 2009, Application No. PCT/US2008/080225.
Pohlack, Jan. 1, 1983, Grundiagen und anwendungen der induzierten resonanzabosorptoon (teil 1), Feingeraetetechnik, XX, XX, vol. 32, No. 7, pp. 321-326.
Specification for PathfinderTM Watch (Model No. PAW1300-1V) on worldwide web page for Casio.com, printed on Oct. 20, 2008.
Nakagawa et al., Wide-Field-of-View Narrow-Band Spectal Filters Based on Photonic Crystal Nanocavities, Optical Society of America, Optics Letters, vol. 27, No. 3, pp. 191-193, 2002.
Office Action dated Jun. 18, 2012 in Chinese App. No. 200880112220.6.
Notice of Reasons for Rejection dated Sep. 25, 2012 in Japanese App. No. 2010-530122.
Notice of Reasons for Rejection dated Apr. 24, 2012 in Japanese App. No. 2010-530122.
Notice of Reasons for Rejection dated Apr. 17, 2012 in Japanese App. No. 2010-530123.
Office Action dated May 2, 2011 in U.S. Appl. No. 12/254,766.
Office Action dated Jul. 19, 2010 in U.S. Appl. No. 11/966,850.
IPRP dated Jan. 29, 2010 in PCT/US08/078498.
Office Action dated Feb. 4, 2010 in U.S. Appl. No. 12/254,766.
Office Action dated Aug. 9, 2011 in U.S. Appl. No. 12/254,782.
International Search Report in PCT/US2008/080222 (International Publication No. WO 2009/052324) dated Jun. 19, 2009.
International Preliminary Report on Patentability in PCT/US2008/080222 (International Publication No. WO 2009/052324) dated Jan. 29, 2010.
IPRP dated Jan. 29, 2010 in PCT/US08/080225.
Office Action dated Nov. 26, 2012 in U.S. Appl. No. 13/444,474.
Office Action dated Aug. 18, 2011 in Chinese App. No. 200880112220.6.
Office Action dated May 25, 2011 in Chinese App. No. 200880112219.3.
Billard C, "Tunable Capacitor," 5th Annual Review of LETI, 2003, 7 Pages.
Carabe J, et al., "Thin-Film-Silicon Solar Cells," Opto-Electronics Review 12, 2004, No. 1, pp. 1-6.
Chemical Properties Handbook, McGraw-Hill, 1999, Refractive Index, Dipole Moment and Radius of Gyration; Inorganic Compounds, No. 151: O2Si.
Conner, "Hybrid Color Display using Optical Interference Filter Array," SID Digest, 1993, 577-580.
Feenstra, et al., "Electrowetting displays," Liquavista BV, Jan. 2006, 16 pp.
Hohlfeld, et al., "Micro-Machined Tunable Optical Filters With Optimized Band-Pass Spectrum," 12th International Conference on Transducers, Solid-State Sensors, Actuators and Microsystems, 2003, vol. 2, 1494-1497.
Jerman et al., "A Miniature Fabry-Perot Interferometer with a Corrugated Silicon Diaphragm Support", IEEE Electron Devices Society, pp. 140-144, 1990.
Jerman, et al., "Miniature Fabry-Perot Interferometers Micromachined in Silicon for use in Optical Fiber WDM Systems," Transducers, Proceedings on the International Conference on Solid State Sensors and Actuators, 1991, vol. ConF. 6, San Francisco, 372-375.
Kowarz, et al., "Conformal Grating Electromechanical System (Gems) for High-Speed Digital Light Modulation," Proceedings of the IEEE 15th Annual International Conference on Micro Electro Mechanical Systems, MEMS 2002, pp. 568-573.
Lezec, "Submicrometer Dimple Array Based Interference Color Field Displays and Sensors," Nano Letters, 2006, 7(2), 329-333.
Londergan, et al., "Advanced processes for MEMS-based displays," Proceedings of the Asia Display, 2007, SID, 1, 107-112.
Longhurst R.S., "Geometrical and Physical Optics", Chapter IX: Multiple Beam Interferometry, pp. 153-157,1963.
Magel G.A., "Integrated Optic Devices using Micromachined Metal Membranes," SPIE, 1996, vol. 2686, 54-63.
Mehregany, et al., "MEMS Applications in Optical Systems," IEEE/LEOS 1996 Summer Topical Meetings, 1996, 75-76.

(56) References Cited

OTHER PUBLICATIONS

Miles M.W., "A MEMS Based Interferometric Modulator (IMOD) for Display Applications" Proceedings of Sensors Expo, Oct. 21, 1997 © 1997 Helmer's Publishing, Inc. (Oct. 21, 1997), pp. 281-284 XP009058455.

Miles M.W., "A New Reflective FPD Technology using Interferometric Modulation," Journal of the SID, 1997, vol. 5(4), 379-382.

Miles M.W., et al., "Interferometric Modulation MEMS as an enabling technology for high-performance reflective displays," Proceedings of the SPIE, 2003, 4985, 131-139.

Nieminen, et al., "Design of a Temperature-Stable RF MEMS Capacitor," Institute of Electrical and Electronics Engineers (IEEE) Journal of Microelectromechanical Systems, 2004, vol. 13(5), 705-714.

Pape, et al., "Characteristics of the Deformable Mirror Device for Optical Information Processing," Optical Engineering, Nov.-Dec. 1983, 22(6), 676-681.

Qualcomm MEMS Technologies, Inc., May 2008, Interferometric Modulator (IMOD), Technology Overview, White Paper, 14 pp.

Sopori J, et al., "Light-Trapping in a-Si Solar Cells a Summary of the Results from PV Optics," Presented at the National Center for Photovoltaics Program Review Meeting—Denver, Colorado, Sep. 8-11, 1998, pp. 1-6.

Sperger, et al., "High Performance Patterned All-Dielectric Interference Colour Filter for Display Applications," SID Digest, 1994, 81-83.

Su N., "Solar Cells Frontiers in Materials and Devices," Presentations in EE 666 Advanced Semiconductor Devices, Apr. 14, 2005.

Taii. et al., "A Transparent Sheet Display by Plastic MEMS," Journal of the SID, 2006, vol. 14 (8), 735-741.

Tolansky, "Multiple-Beam Interference in Multiple-Beam Interferometry of Surfaces and Films," Chap II Oxford at the Clarendon Press, 1948, pp. 8-11.

Wang, et al., "Design and Fabrication of a Novel Two-Dimension MEMS-Based Tunable Capacitor," IEEE International Conference on Communications, Circuits and Systems and West Sino Expositions, 2002, vol. 2, 1766-1769.

Winton et al., "A novel way to capture solar energy," Chemical Week, pp. 17-18 (May 15, 1985).

Wu, et al., "Design of a Reflective Color LCD using Optical Interference Reflectors," Asia Display, Changchun Institute of Physics, 1995, 929-931.

\* cited by examiner

| | Column Output Signals | |
|---|---|---|
| | $+V_{bias}$ | $-V_{bias}$ |
| Row Output Signals   0 | Stable | Stable |
| $+\Delta V$ | Relax | Actuate |
| $-\Delta V$ | Actuate | Relax |

DISPLAY WITH INTEGRATED PHOTOVOLTAIC DEVICE

CROSS-REFERENCE TO RELATED APPLICATIONS

This application is a continuation of U.S. patent application Ser. No. 12/254,766, filed on Oct. 20, 2008, which claims priority under 35 U.S.C. §119(e) to U.S. Provisional Application Ser. No. 60/999,566 filed on Oct. 19, 2007, titled "COLORED PHOTOVOLTAICS USING INTERFEROMETRIC DISPLAY DEVICES AND PHOTOVOLTAIC INTEGRATED INTERFEROMETRIC DISPLAYS", the disclosure of which is hereby expressly incorporated by reference in its entirety.

This application is related to U.S. patent application Ser. No. 11/966,850, filed on Dec. 28, 2007, titled "PHOTOVOLTAIC DEVICES WITH INTEGRATED COLOR INTERFEROMETRIC FILM STACKS" and Application Ser. No. 12/254,782, titled "DISPLAY WITH INTEGRATED PHOTOVOLTAICS", filed on Oct. 20, 2008.

BACKGROUND

1. Field of the Invention

The invention relates generally to display devices for actively displaying images.

2. Description of the Related Technology

Active displays may be made up of pixels that are fully or partly reflective, transmissive, or emissive. Hence a display may generate images with pixels that operate by fully or partially reflecting incident ambient light, pixels that are light-emissive, or transmissive pixels where light is generated from within the display and projected upon the transmissive pixels. Reflective display technologies may include, but are not limited to, liquid crystal, MEMS (such as interferometric modulator), electrophoretic (such as e-ink or e-paper), and other display technologies using reflected ambient light to generate an image. Emissive displays include displays with a backlight to illuminate the active transmissive pixels, such as a liquid crystal or thin film transistor liquid crystal, or displays where the active pixels themselves generate or emit light such as vacuum fluorescent, light emitting diode, organic light emitting diode, or surface-conduction electron-emitter displays.

Displays can include MEMS devices, such as an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident in the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

In one embodiment, a display device displays an image toward a front side, with a back side opposite the front side. The display device comprises a display and a photovoltaic cell. The display includes an array of active pixels in an image region. The photovoltaic cell includes a photovoltaic material formed over one of the front side and the back side of the display in the image region. The photovoltaic cell is oriented to be capable of receiving light.

In another embodiment, a method of manufacturing a display device is provided. The display device is configured to display an image toward a front side, with a back side opposite the front side. The method includes providing a display comprising an array of active pixels in an image region. The method also includes disposing a photovoltaic material over one of a front and a back side of the display in the image region.

In yet another embodiment, a method of operating a display is provided. The method includes receiving light in a photovoltaic material at one of a front side and a back side of a display element in an image region. The method also includes converting the light into electricity.

In an alternative embodiment, a display device displays an image toward a front side, with a back side opposite the front side. The display device includes a means for displaying a pixilated image and a means for converting light into electricity. The converting means is positioned over one of a front side and a back side of the displaying means.

BRIEF DESCRIPTION OF THE DRAWINGS

Example embodiments disclosed herein are illustrated in the accompanying schematic drawings, which are for illustrative purposes only. The following figures are not necessarily drawn to scale.

DETAILED DESCRIPTION OF CERTAIN EMBODIMENTS

Figure 1:
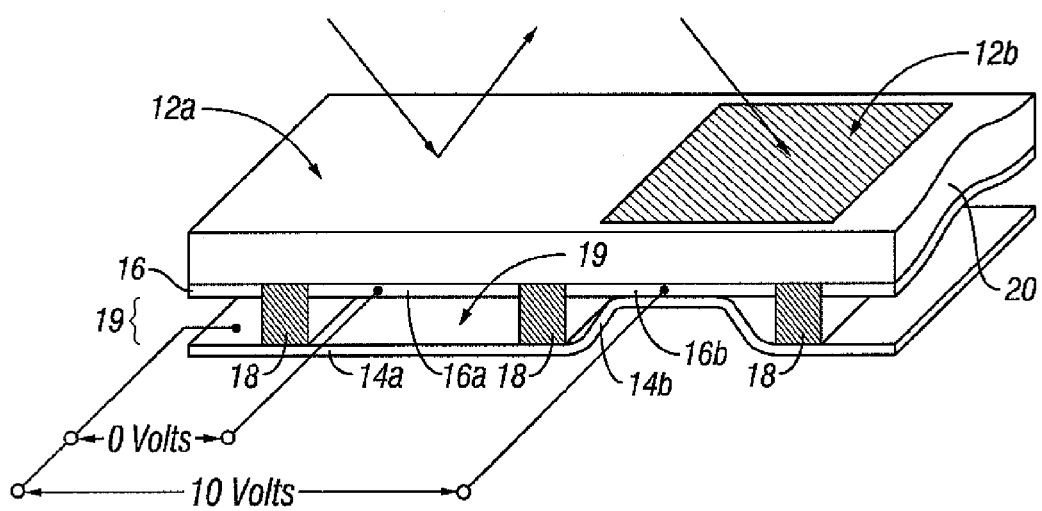
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

Although certain embodiments and examples are discussed herein, it is understood that the inventive subject matter extends beyond the specifically disclosed embodiments to other alternative embodiments and/or uses of the invention and obvious modifications and equivalents thereof. It is intended that the scope of the inventions disclosed herein should not be limited by the particular disclosed embodiments. Thus, for example, in any method or process disclosed herein, the acts or operations making up the method/process may be performed in any suitable sequence and are not necessarily limited to any particular disclosed sequence. Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein. The following detailed description is directed to certain specific embodiments of the invention. However, the invention can be embodied in a multitude of different ways. The embodiments described herein may be implemented in a wide range of display devices.

In this description, reference is made to the drawings wherein like parts are designated with like numerals throughout. The embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). PV cells may be integrated with active displays such as emissive, transmissive, and reflective or partially reflective (transflective) displays. The PV cell may collect light in inactive regions of the display, such as gaps, spaces, holes, spacers, pillars, posts, rails, or other support structures formed from a transparent or translucent material such as air, silicon dioxide, or other material. Similarly, the active structures, elements, or pixels in a display may be somewhat transmissive, even if they are primarily designed to be reflective. The PV cell may be formed in front of or behind the display, and in some embodiments blanket PV materials extend across the array. One kind of reflective or transflective display technology is a MEMS-based display technology called an interferometric modulator.

Figure 6A:
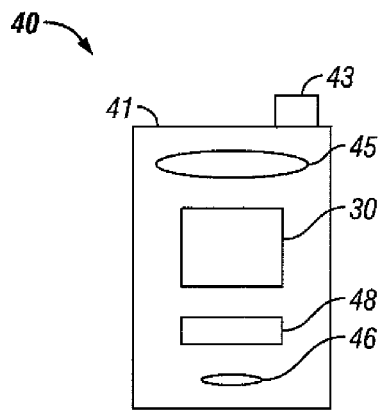
FIGS. 6A and 6B are system block diagrams illustrating an embodiment of a visual display device comprising a plurality of interferometric modulators.
Figure 6B:
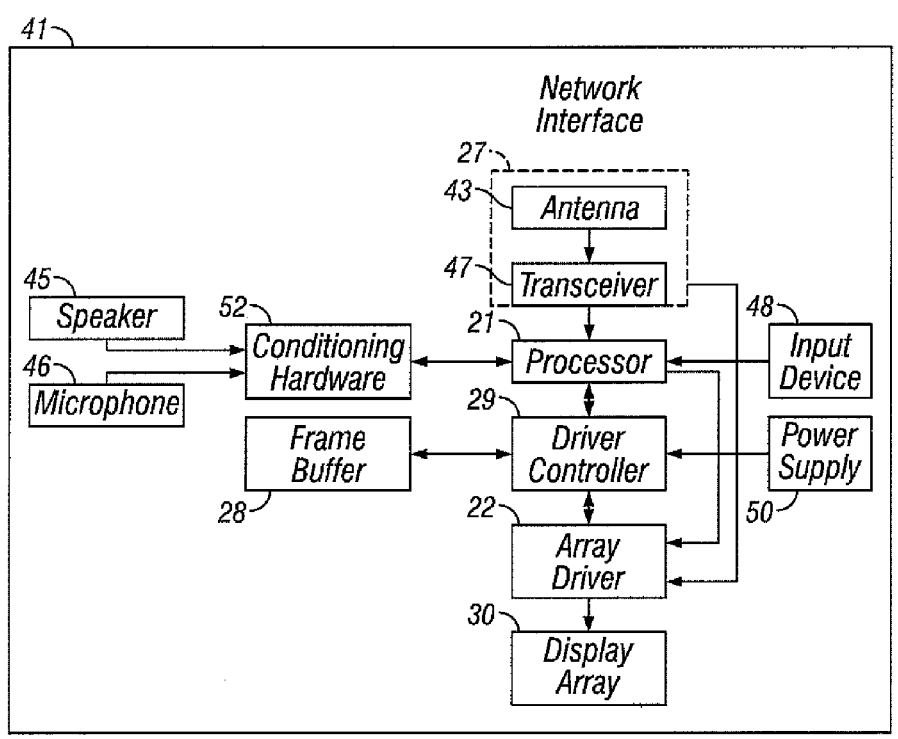
Figure 7A:
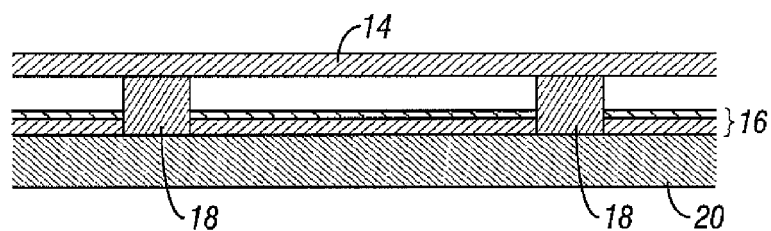
FIG. 7A is a cross section of the device of FIG. 1.
Figure 7B:
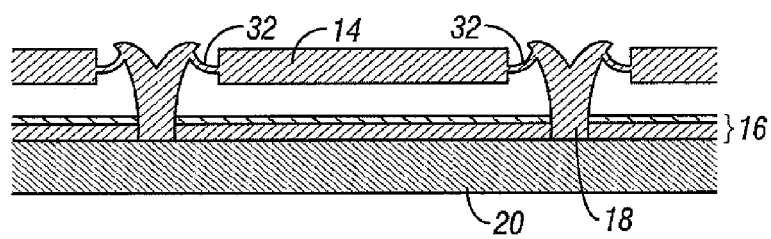
FIG. 7B is a cross section of an alternative embodiment of an interferometric modulator.
Figure 7C:
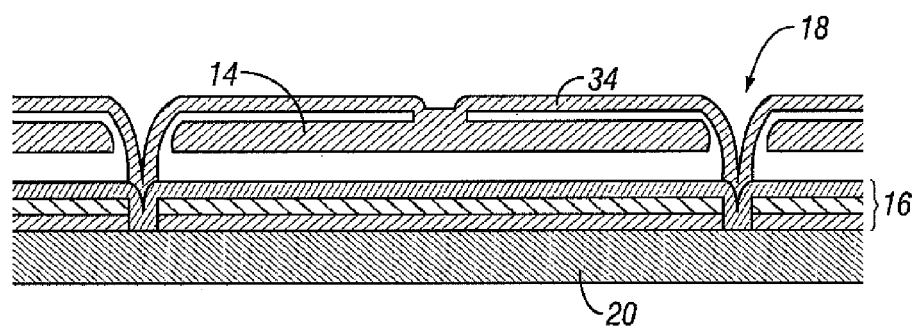
FIG. 7C is a cross section of another alternative embodiment of an interferometric modulator.
Figure 7D:
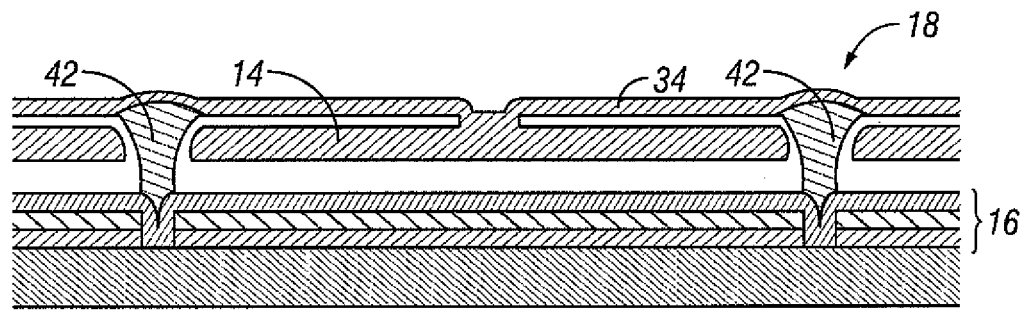
FIG. 7D is a cross section of yet another alternative embodiment of an interferometric modulator.
Figure 7E:
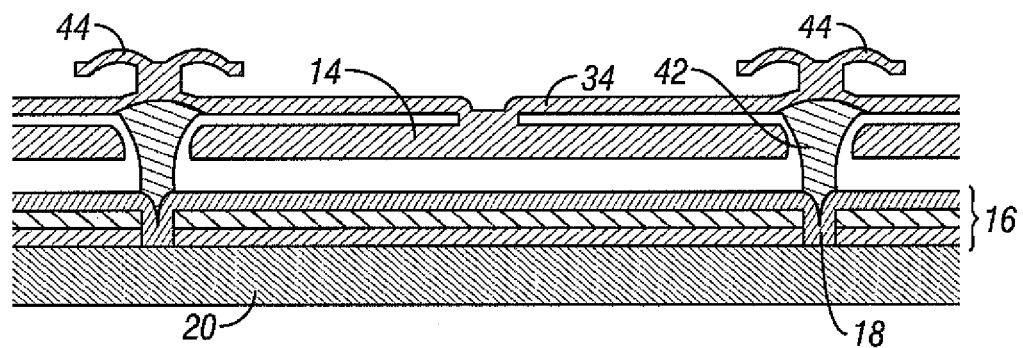
FIG. 7E is a cross section of an additional alternative embodiment of an interferometric modulator.
Figure 8:
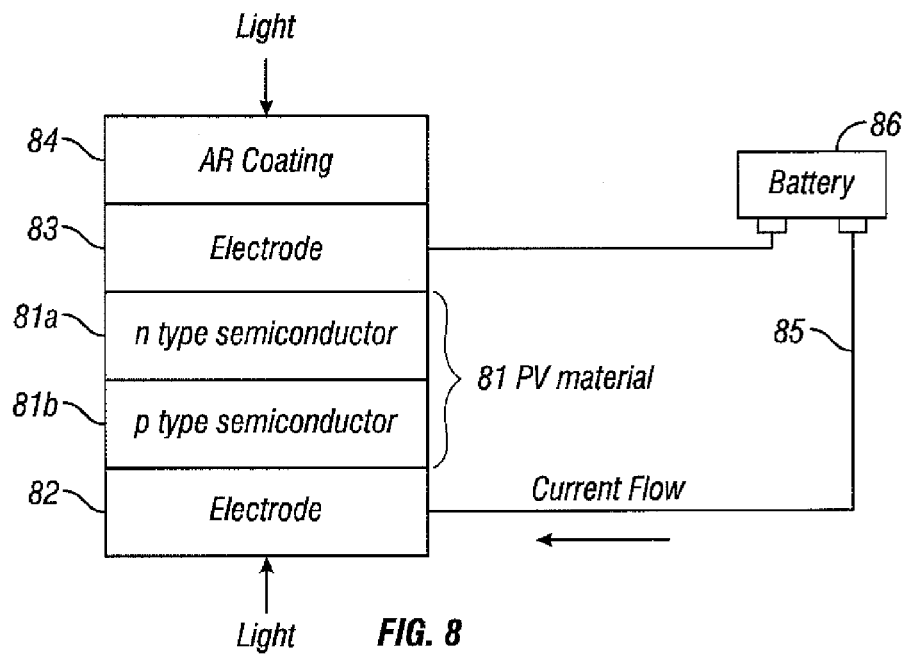
FIG. 8 schematically illustrates a photovoltaic cell comprising a p-n junction.

Initially, FIGS. 1-7E illustrate some basic principles behind interferometric modulator displays. FIGS. 8-9 illustrate some basic principles behind PV cells and devices. FIGS. 10-17 illustrate embodiments in which displays are integrated with photovoltaic cells.

One interferometric modulator display embodiment comprising an interferometric MEMS display element is illustrated in FIG. 1. In these devices, the pixels are in either a bright or dark state. In the bright ("relaxed" or "open") state, the display element reflects a large portion of incident visible light to a user. When in the dark ("actuated" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b (also known as "mirrors" or "reflectors") may be formed as a series of parallel strips of a deposited metal layer or layers (orthogonal to the row electrodes of 16a, 16b) to form columns deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device. Note that FIG. 1 may not be to scale. In some embodiments, the spacing between posts 18 may be on the order of 10-100 um, while the gap 19 may be on the order of <1000 Angstroms. The partially reflective layer may also be referred to as an optical absorber. Hence an active interferometric modulator may be said to comprise, in some embodiments, an absorber and a reflector, separated by a variable optical cavity or gap.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential (voltage) difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this figure) within the optical stack 16 may prevent shorting and control the separation distance between layers 14 and 16, as illustrated by actuated pixel 12b on the right in FIG. 1. The behavior is the same regardless of the polarity of the applied potential difference.

FIGS. 2 through 5 illustrate one exemplary process and system for using an array of interferometric modulators in a display application.

Figure 2:
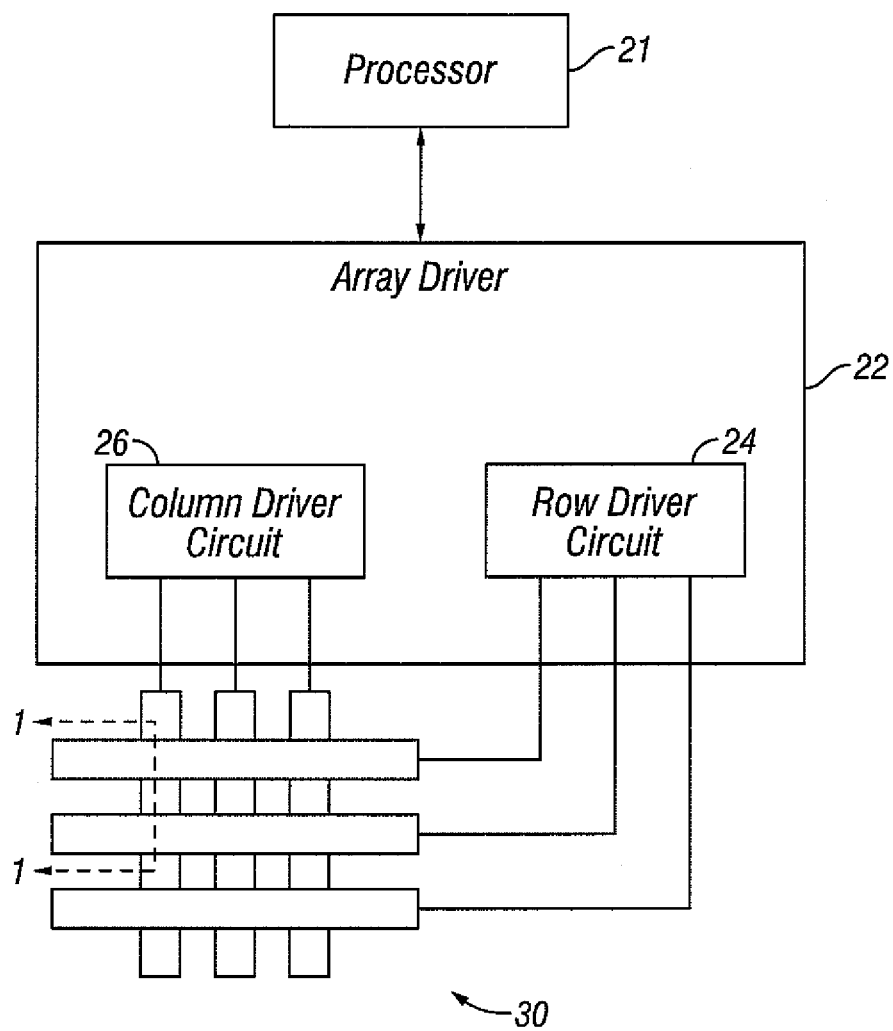
FIG. 2 is a system block diagram illustrating one embodiment of an electronic device incorporating a 3×3 interferometric modulator display.

FIG. 2 is a system block diagram illustrating one embodiment of an electronic device that may incorporate interferometric modulators. The electronic device includes a processor 21 which may be any general purpose single- or multi-chip microprocessor such as an ARM®, Pentium®, 8051, MIPS®, Power PC®, or ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. Note that although FIG. 2 illustrates a 3×3 array of interferometric modulators for the sake of clarity, the display array 30 may contain a very large number of interferometric modulators, and may have a different number of interferometric modulators in rows than in columns (e.g., 300 pixels per row by 190 pixels per column).

Figures 3, 4:
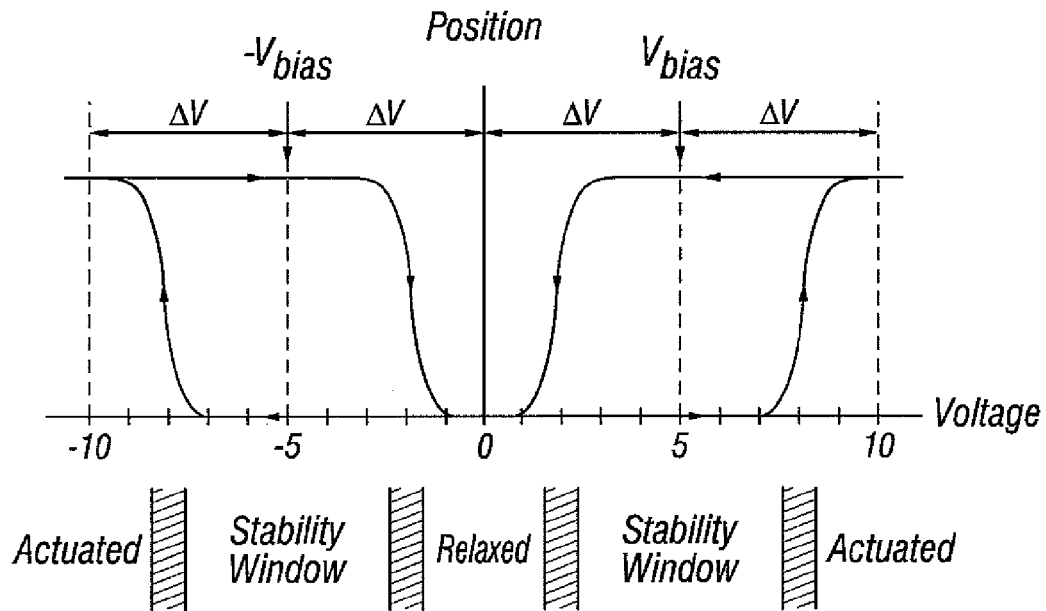
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIG. 3 is a diagram of movable mirror position versus applied voltage for one exemplary embodiment of an interferometric modulator of FIG. 1. For MEMS interferometric modulators, the row/column actuation protocol may take advantage of a hysteresis property of these devices as illustrated in FIG. 3. An interferometric modulator may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state or bias voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

As described further below, in typical applications, a frame of an image may be created by sending a set of data signals (each having a certain voltage level) across the set of column electrodes in accordance with the desired set of actuated pixels in the first row. A row pulse is then applied to a first row electrode, actuating the pixels corresponding to the set of data signals. The set of data signals is then changed to correspond to the desired set of actuated pixels in a second row. A pulse is then applied to the second row electrode, actuating the appropriate pixels in the second row in accordance with the data signals. The first row of pixels are unaffected by the second row pulse, and remain in the state they were set to during the first row pulse. This may be repeated for the entire series of rows in a sequential fashion to produce the frame. Generally, the frames are refreshed and/or updated with new image data by continually repeating this process at some desired number of frames per second. A wide variety of protocols for driving row and column electrodes of pixel arrays to produce image frames may be used.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
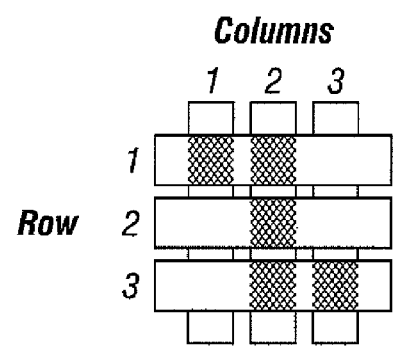
FIGS. 5A and 5B illustrate one exemplary timing diagram for row and column signals that may be used to write a frame of display data to the 3×3 interferometric modulator display of FIG. 2.
Figure 5B:
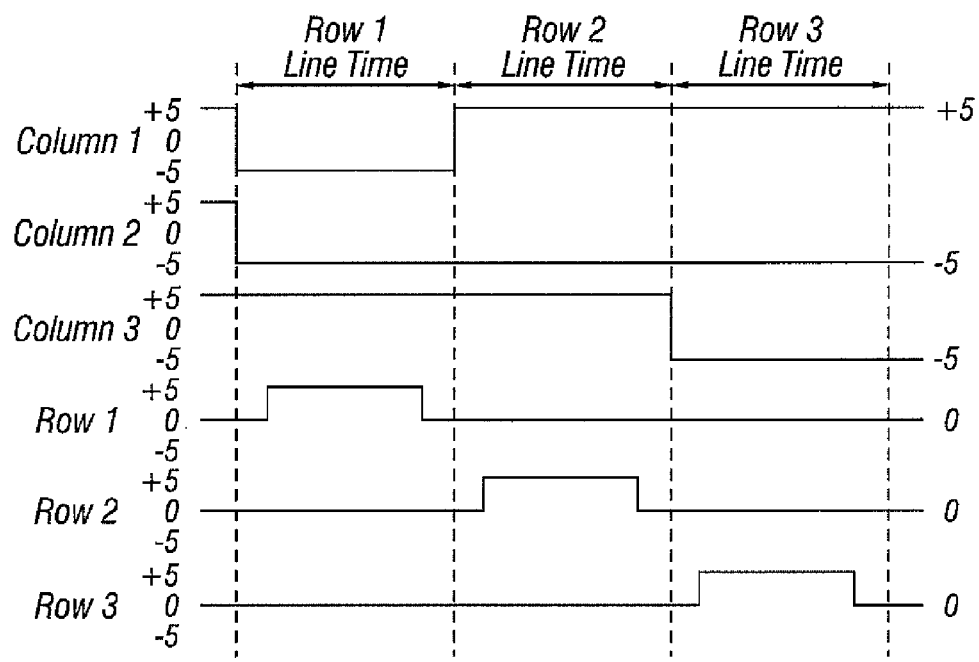

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are initially at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. The same procedure can be employed for arrays of dozens or hundreds of rows and columns. The timing, sequence, and levels of voltages used to perform row and column actuation can be varied widely within the general principles outlined above, and the above example is exemplary only, and any actuation voltage method can be used with the systems and methods described herein.

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, W-CDMA, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46.

Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, the driver controller 29 is integrated with the array driver 22. Such an embodiment is common in highly integrated systems such as cellular phones, watches, and other small area displays. In yet another embodiment, the display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell, including a plastic solar cell, and solar-cell paint. In another embodiment, the power supply 50 is configured to receive power from a wall outlet.

In some implementations control programmability resides, as described above, in a driver controller which can be located in several places in the electronic display system. In some cases control programmability resides in the array driver 22. The above-described optimization may be implemented in any number of hardware and/or software components and in various configurations.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 of each interferometric modulator is square or rectangular in shape and attached to supports 18 at the corners only, on tethers 32. In FIG. 7C, the moveable reflective layer 14 is square or rectangular in shape and suspended from a deformable layer 34, which may comprise a flexible metal. The deformable layer 34 connects, directly or indirectly, to the substrate 20 around the perimeter of the deformable layer 34. These connections are herein referred to as supports, which can take the form of posts, rails or walls. The embodiment illustrated in FIG. 7D the supports include support post plugs 42 upon which the deformable layer 34 rests. The movable reflective layer 14 remains suspended over the gap, as in FIGS. 7A-7C, but the deformable layer 34 does not form the supports by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. For example, such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Certain embodiments disclosed herein include photovoltaic (PV) cells or devices integrated with displays comprising MEMS, LCD, LED, or other display technology. Such displays may actively display images or information while simultaneously collecting ambient and/or display-generated light for conversion into electricity. Hence an active (programmable) outdoor display may advantageously convert unused sunlight to electricity, or a display on a mobile device may help offset standby power usage by collecting ambient light.

In some embodiments, transmissive PV cells may overlie the display image regions. In other embodiments, PV active materials are included within the active image regions or array areas of display devices to capture, and convert to electricity, unused ambient or display-generated light. Depending upon the active display technology, up to 30% or more of the display array region's surface area may actually be made up of inactive regions or areas that do not contribute to the pixilated image or information displayed. This means that up to 30% or more of ambient light incident upon active image regions of a display is "wasted," and may therefore be captured by a PV material for useful conversion to electricity. This may be accomplished by placing a blanket PV material behind the display, allowing the ambient light incident upon the display to shine or transmit through inactive regions of the display and onto the blanket PV material underneath. In fact, in some display technologies, the active pixels comprising the active region of a display themselves may be partially transmissive, and hence some light may reach the PV active material even where there are active pixels or elements.

FIG. 8 shows a typical photovoltaic (PV) cell 80. A typical photovoltaic cell can convert light energy into electrical energy or current. A PV cell 80 is an example of a renewable source of energy that has a small carbon footprint and has less impact on the environment. Using PV cells can reduce the cost of energy generation. PV cells can have many different sizes and shapes, e.g., from smaller than a postage stamp to several inches across. The modules of the array can include electrical connections, mounting hardware, power-conditioning equipment, and batteries that store solar energy for use when the sun is not shining.

With reference to FIG. 8, a typical PV cell 80 comprises PV material 81 disposed between two electrodes 82, 83. In some embodiments, the PV cell 80 comprises a substrate on which a stack of layers is formed. The PV material 81 of a PV cell 80 may comprise a semiconductor material such as silicon. In some embodiments, the active region may comprise a p-n junction formed by contacting an n-type semiconductor material 81a and a p-type semiconductor material 81b as shown in FIG. 8. Such a p-n junction may have diode-like properties and may therefore be referred to as a photodiode structure as well.

The PV material 81 is generally sandwiched between two electrodes that provide an electrical current path. The electrodes 82, 83 can be formed of aluminum, silver, or molybdenum or some other conducting material. The electrodes 82, 83 may also be formed of a transparent conducting material. The electrodes 82, 83 may be designed to cover a significant portion of the front surface of the p-n junction so as to lower contact resistance and increase collection efficiency. In embodiments wherein the electrodes 82, 83 are formed of an opaque material, the electrodes 82, 83 may be configured to leave openings over the front of the PV material to allow illumination to impinge on the PV material. In some embodiments, the back or front electrodes 82, 83 can include a transparent conductor, for example, transparent conducting oxide (TCO) such as tin oxide ($SnO_2$) or indium tin oxide (ITO). The TCO can provide electrical contact and conductivity and simultaneously be transparent to the incoming light. As illustrated, the PV cell also comprises an anti-reflective (AR) coating 84 disposed over the front electrode 83, although the AR coating may also optionally be disposed over the back electrode 82 in embodiments where light may be expected to be incident on or transmissive through the back of the PV cell 80 (as in the front PV cell 110 in FIGS. 10, 11, and 13-15 discussed further below). The AR coating 84 can reduce the amount of light reflected from the front surface of the PV active material 81.

When the PV material 81 is illuminated, photons transfer energy to electrons in the active region. If the energy transferred by the photons is greater than the band-gap of the semiconducting material, the electrons may have sufficient energy to enter the conduction band. An internal electric field is created with the formation of the p-n junction. The internal electric field operates on the energized electrons to cause these electrons to move, thereby producing a current flow in an external circuit 85. The resulting current flow can be used to power various electrical devices. For example, the resulting current flow may be stored for later use by charging a battery 86 or a capacitor as shown in FIG. 8, which in turn can power the display.

The PV material(s) can be include any of a variety of light absorbing, photovoltaic materials such as crystalline silicon (c-silicon), amorphous silicon (a-silicon), germanium (Ge), Ge alloys, cadmium telluride (CdTe), copper indium diselenide (CIS), copper indium gallium diselenide (CIGS), light absorbing dyes and polymers, polymers dispersed with light absorbing nanoparticles, or tandem multi-junction photovoltaic materials and films. The PV active material 81 may comprise other appropriate materials, including III-V semiconductor materials include such materials as gallium arsenide (GaAs), indium nitride (InN), gallium nitride (GaN), boron arsenide (BAs). Semiconductor alloys like indium gallium nitride may also be used. Other photovoltaic materials and devices are also possible. Methods of forming these materials are known to those having skill in the art. As an illustrative example, alloys like CIGS can be formed by a vacuum-based process where copper, gallium, and indium are co-evaporated or co-sputtered then annealed with a selenide vapor to form the CIGS structure. Non-vacuum-based alternative processes are also known to those of skill in the art. A deposited thin film PV active material can comprise, for example, an amorphous silicon thin film, which has recently been gaining in popularity. Amorphous silicon as thin films can be deposited over large areas by physical vapor deposition (PVD), chemical vapor deposition (CVD), electrochemical vapor deposition, or plasma-enhanced chemical vapor deposition (PECVD), among other techniques. As is known by those with skill in the art, PV active materials comprising amorphous silicon layers may include one or more junctions with n-doped and/or p-doped silicon and may further comprise p-i-n junctions. Other materials may also be used. The light absorbing material(s) where photons are absorbed and transfer energy to electrical carriers (holes and electrons) is referred to herein as the PV active layer or material of the PV cell, and this term is meant to encompass multiple active sub-layers. The material for the PV active layer can be chosen depending on the desired performance and the application of the PV cell.

Figure 9A:
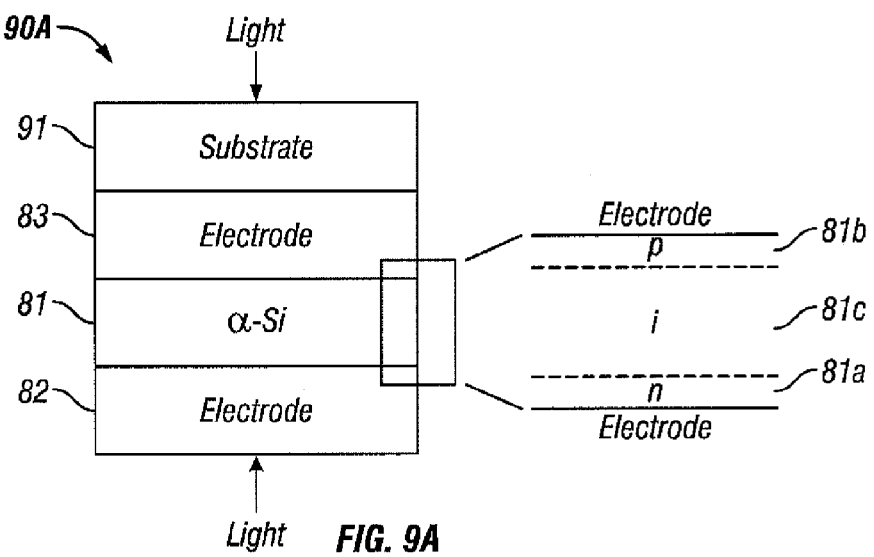
FIG. 9A is a block diagram that schematically illustrates a photovoltaic cell comprising a deposited thin film photovoltaic active material.

FIG. 9A is a block diagram schematically illustrating a typical thin film PV cell 90B. The typical thin film PV cell 90B includes a glass substrate 91 through which light can pass. Disposed on the glass substrate 91 are a first electrode layer 83, a PV material 81 (shown as comprising amorphous silicon), and a second electrode layer 82. The first electrode layers 83 can include a transparent conducting material such as ITO. As illustrated, the first electrode layer 83 and the second electrode layer 82 sandwich the thin film PV material 81 therebetween. The illustrated PV material 81 comprises an amorphous silicon layer, but other PV thin film materials are also known. As is known in the art, amorphous silicon serving as a PV material may comprise one or more diode junctions.

Furthermore, an amorphous silicon PV layer or layers may comprise a p-i-n junction wherein a layer of intrinsic silicon 81c is sandwiched between a p-doped layer 81b and an n-doped layer 81a. A p-i-n junction may have higher efficiency than a p-n junction. In some other embodiments, the PV cell can comprise multiple junctions.

Layers 81, 82, 83 may be deposited using deposition techniques such as physical vapor deposition techniques, chemical vapor deposition techniques, electro-chemical vapor deposition techniques, etc. Thin film PV cells may comprise amorphous or polycrystalline materials such as thin-film silicon, CIS, CdTe or CIGS. Some advantages of thin film PV cells are small device footprint and scalability of the manufacturing process among others.

Figure 9B:
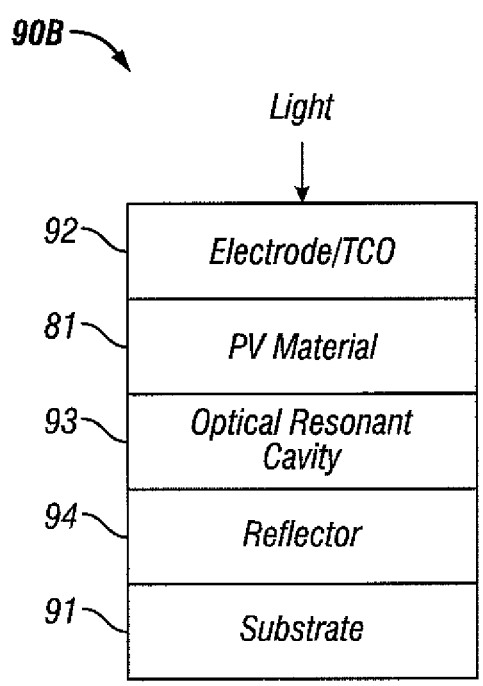
FIG. 9B is a block diagram that schematically illustrates a photovoltaic cell comprising an interferometrically enhanced photovoltaic stack.

FIG. 9B depicts an example of an interferometrically enhanced PV stack or cell 90B. The interferometrically enhanced PV cell 90B includes a PV active material or layer 81. The PV material 81 may comprise a thin film photovoltaic material formed over a substrate 91. An optical resonant cavity 93 and a reflector 94 disposed below the PV material 81 are configured to interferometrically enhance the strength of the electric field in the PV material 81, resulting in an interferometrically enhanced PV cell 90B with improved efficiency. The electrode 92 covering the PV material 81 may be opaque in some areas to facilitate the conduction of electrons and/or holes out of the PV material 81. Otherwise, the PV material 81 may also be covered with an electrode 92 comprising a transparent conducting oxide (TCO) layer, or both a TCO layer and an opaque electrode. Similarly, the optical resonant cavity 93 may comprise a TCO layer that serves both as a part of an optical resonant cavity 93 as well as a conducting layer for holes and/or electrons to conduct out of the PV material 81. The PV material 81 may comprise a thin film photovoltaic material, such as amorphous silicon, CIGS or other thin semiconductor film photovoltaic material. The optical properties (dimensions and material properties) of the reflector 94 and optical resonant cavity 93 are selected so that reflection from interfaces of the layered PV device 90B coherently sum to produce an increased field of a suitable wavelength distribution and phase in the PV material 81 of the PV cell 90B where optical energy is converted into electrical energy. Such interferometrically enhanced photovoltaic devices increase the absorption of optical energy in the active region of the interferometric photovoltaic cell and thereby increase the efficiency of the device. In variations on this embodiment, multiple optical resonant cavities can be employed to separately tune different wavelengths of light and maximize absorption in the PV material(s). The buried optical resonant cavities and/or layers may comprise transparent conductive or dielectric materials, air gaps, or combinations thereof.

Given that certain advantages may be obtained by integrating PV cells with displays, the embodiments below describe incorporating or integrating photovoltaic cells with display devices. Photovoltaic cells may be arranged so as to capture light incident upon, reflected from, or generated by the display and convert it to electricity. Advantageously, in preferred embodiments, photovoltaic cells may be integrated with displays that depend primarily on ambient light, although other display technologies may also be used.

Figure 10:
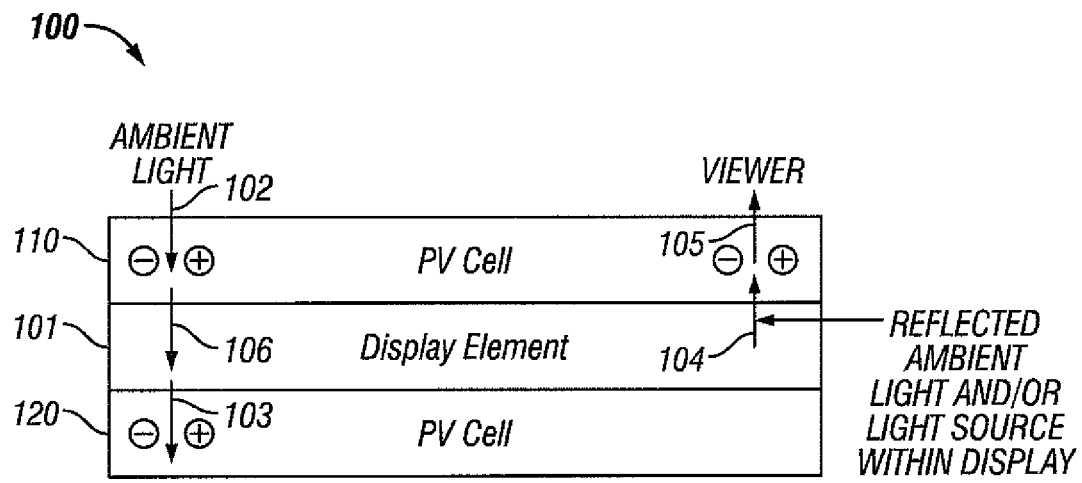
FIG. 10 schematically illustrates a generic display integrated with photovoltaic cells.

FIG. 10 depicts a generalized schematic of an embodiment of a PV-integrated display device 100, wherein a display element 101 is integrated with PV cells 110, 120. "Display element" is used herein to represent a feature of an active display (e.g., a pixel, array of pixels or a gap between pixels in a pixel array) within the active image region.

In some embodiments, as shown in FIG. 10, the display element 101 is integrated with two PV cells, a front PV cell 110 in front of the display element 101, and a back PV cell 120 behind the display element 101. In other embodiments, the PV-integrated display device 100 may have a single PV cell 110 in front of the display element 101, or a single PV cell 120 behind the display element 101. The display element 101 in the PV-integrated display device 100 may comprise any of a number of display technologies, including transmissive, reflective, transflective, or emissive. Examples of such technologies include interferometric modulator, liquid crystal, thin film transistor liquid crystal, vacuum fluorescent, light emitting diode, organic light emitting diode, electrophoretic, plasma, or surface-conduction electron-emitter display.

As illustrated in FIG. 10, ambient light 102 is incident on a PV-integrated display device 100. As the ambient light 102 passes through the PV material in the front PV cell 110, a portion of the light is received and converted to electricity in the photovoltaic material and another portion of the light 106 is incident upon the display element 101. Then some light 103 may pass through the display element 101 and then be incident upon the PV material in back PV cell 120. There may also be some light 104 reflected or emitted by the display element 101 that then passes through the PV material in front PV cell 110. There, a portion of the light is received and converted to electricity in the photovoltaic material and another portion of the light 105 is transmitted to the viewer.

The display element 101 may comprise features that permit ambient light 102 to transmit through the display element 101, such as holes, gaps or voids, as well as transparent physical structures. In addition, some active pixel areas may be transmissive or transflective. Hence, a PV cell 120 placed behind the display element 101 may capture some light 103 that, due to various structures in the display element 101, may transmit through the display element 101. Placement of a PV cell 120 behind the display may then beneficially be used to generate electricity.

Similarly, various kinds of display elements 101 may be integrated with a PV cell 110 formed in front of the display element 101. In such embodiments, some ambient light 102 may be captured by the PV cell 110 and used to generate electricity. Additionally, some of the light 104 reflected, emitted, or transmitted through the display element 101 toward a viewer is absorbed by the PV cell 110, leaving some light 105 to reach the viewer. This may reduce the contrast of the display element 101. However, the PV cell 110 formed in front of the display element 101 may be configured to be transmissive enough so as to reduce the adverse effect of the PV cell 110 on image quality. In addition to light 104 reflected or emitted from the display element 101, the PV cell 110 situated in front of the display element 101 will absorb and convert ambient light 102 to electricity, thereby generating an electric current. Therefore, although the PV cell 110 may reduce contrast of the display element 101, the tradeoff may be worth it in applications where the display element 101 may be expected to be in environments with considerable ambient light 102, such as a cell phone, or an outdoor display. Hence, in some embodiments, the PV cell 110 placed in front of the display element 101 is sufficiently transmissive both to allow some incident light 102 to reach the display so that sufficient light 106 strikes the display (especially in the case of a reflective or transflective display) as well as to allow sufficient light 104 transmitted, emitted, or reflected from the display element 101 to reach the viewer. In alternative embodiments, the PV cell may be patterned to be formed in front of areas in the display element 101 that are not used to generate an image (e.g., in between pixels in an image region of a display).

Figure 11:
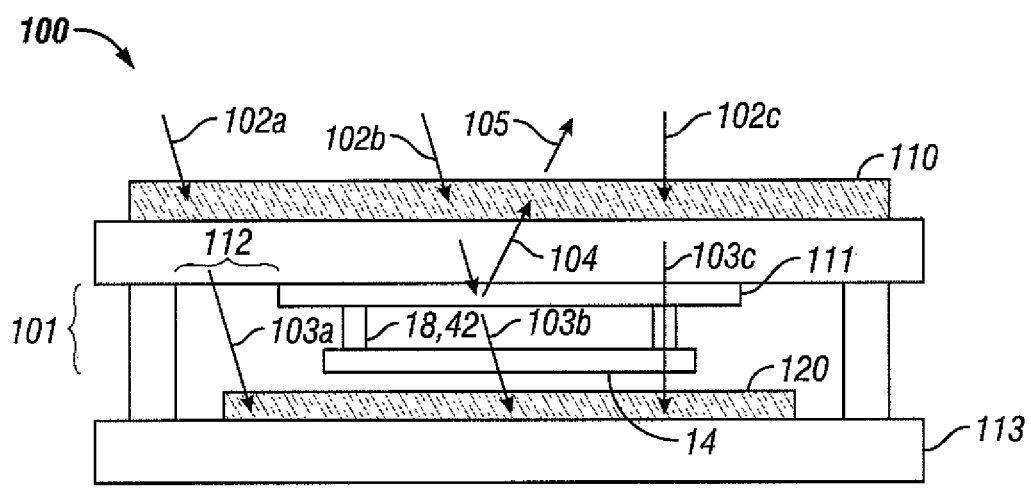
FIG. 11 illustrates a simple display with one interferometric modulator pixel schematically representing an array of display pixels integrated with a photovoltaic cell.

FIG. 11 depicts a schematic of a PV-integrated display 100, showing just a single interferometric modulator pixel 111 for purposes of illustration. The skilled artisan will appreciate, however, that a display can comprise hundreds, thousands or millions of interferometric modulator pixels and subpixels (e.g., like those depicted in FIGS. 7A-7E) and the principles and advantages may be generalized to other kinds of displays. In some embodiments, PV cells 110, 120 may be disposed in front and/or behind the display element 101 to capture light for the generation of electricity. Although illustrated with both a front PV cell 110 as well as a back PV cell 120, it will be understood that that PV-integrated display 100 may comprise only front PV cell 110 or back PV cell 120. In embodiments where the PV cell 110 is disposed in front of the display, some ambient light 102a, 102b, 102c incident upon the PV cell 110 will generate electricity. For the display element 101 to be visible, the PV cell 110 is preferably at least partially transmissive to allow some light to then transmit to a pixel 111 within display element 101. Light transmitted through the PV cell 110 to the pixel 111 may then be partly reflected 104 (or with little reflection when the pixel is dark) to the viewer and partly transmitted to a PV cell 120 behind the display. The transmitted light 103a, 103b, 103c may then generate further electricity.

In embodiments with PV cell 120 disposed behind the display element 101, the PV cell 120 may capture ambient light 102a, 102b, 102c that is transmitted through or past the display element 101 as illustrated by rays 103a, 103b, 103c. Reflective or transflective displays do not always either absorb or reflect all incident ambient light back towards a viewer. Light may pass through a display element 101 (an the active image region or at the periphery) due to many different reasons. Placing a PV cell 120 behind the display element 101 may advantageously capture this unused light for the generation of electricity.

For example, ambient light 102a incident near the periphery of a pixel or an active display region may simply pass through a gap 112 in the display, such as at the edges of an array or between pixels. Additionally, an interferometric display element 101 may comprise features such as holes, spaces or gaps in the opaque or translucent features through which light may pass. Often, such regions or areas are masked using a black mask to prevent such features from adversely affecting the viewed image. For example, gaps 112 within the active image region of the display element 101 may expose highly reflective structures underneath, such as a backplate 113, and may appear white and therefore wash out the image. Instead of masking these regions, a PV cell 120 may be placed behind the display element 101 so as to convert transmitted light 103a to electricity, and such a PV cell 120 may simultaneously serve as a black mask by absorbing light that gets through the display element 101 and reverting reflections back to the viewer. Such a PV cell 120 may also be oriented so as to be in front of highly reflective surfaces in the rear of or behind the display. For example, a backplate 113 as shown can be highly reflective, but the highly reflective surface maybe any highly reflective surface situated behind the display element 101. The display element 101 may also comprise other features which contribute to transmission of ambient light through the display. For example, the display may comprise physical structures such as posts 18, support post plugs 42, rails, or pillars. These structures may be made of transparent materials, and may therefore transmit considerable light 103c to a PV cell 120 situated behind the display element 101.

Additionally, active pixels 111 in a reflective or transflective display may transmit some light 103b through to a PV cell 120 placed behind the display. For example, the MEMS reflector or mirror 14, while partially reflective, may transmit some light 103b. This may be due to the thickness of the metal layer forming the mirror 14, or may be due to holes formed within the mirror 14. Without a PV cell 120 disposed behind the mirror 14 (opposite side of the mirror 14) from substrate 20, such light would be wasted.

The examples of light passing around or between pixels (as in light ray 103a) and through support structures 18, 42 (as in light ray 103c) demonstrate taking advantage of light passing through inactive regions within the image region or MEMS array. Materials can be chosen to maximize transmission through such inactive regions. Similarly, the shape, material, and/or thickness of the mirror 14 can be selected to maximize transmission through the active regions of the pixels (as in light ray 103b) without sacrificing the moving mirror functions for the MEMS interference modulator.

Figure 12:
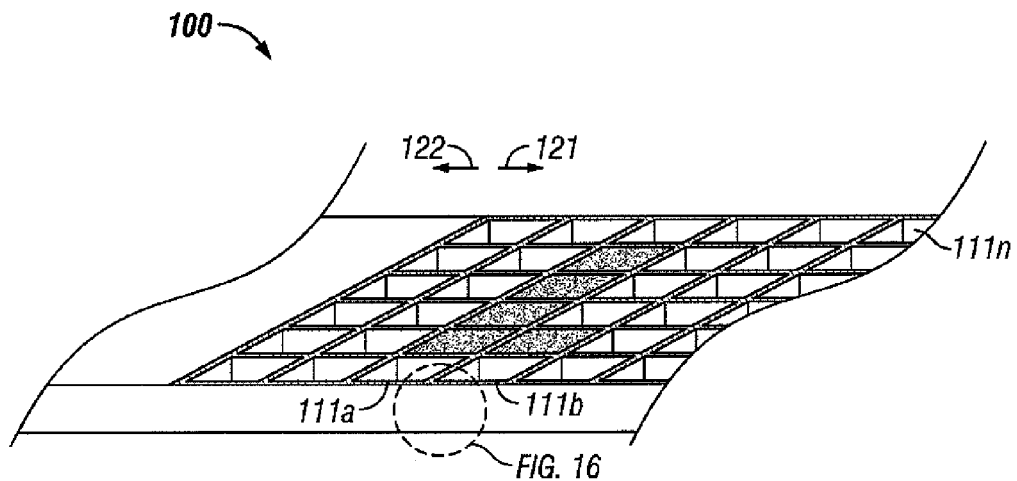
FIG. 12 illustrates a display with an array of active pixels in an image display region.

FIG. 12 depicts a display element 101 displaying an image toward a viewer on a front, light-incident side. The display element 101 comprises an image region 121, and a non-image region 122. The image region 121 includes at least one active pixel 111a. Typically, the image region 121 includes an array of active pixels 111a, 111b, . . . , 111n. The active pixels 111a, 111b, . . . , 111n may be any kind of pixel used in various display technologies as disclosed elsewhere herein, and not all pixels need be of the same type. For example, each active pixel may be a pixel or sub-pixel comprising an interferometric modulator, an LCD pixel, or an electrophoretic pixel. The non-image region 122 can include areas such as the periphery of the display where there are no active pixels or an area outside of a grid or array of active pixels 111a, 111b, . . . , 111n.

Figure 13:
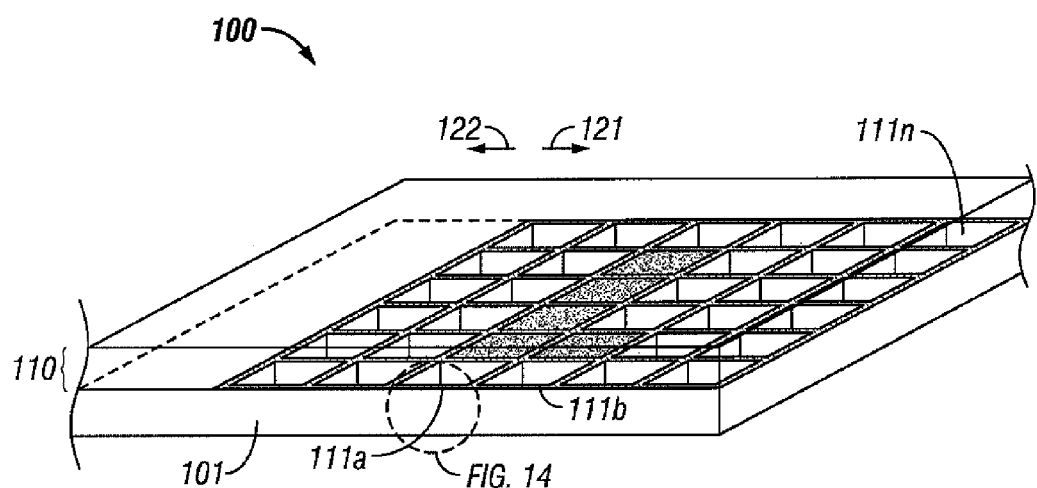
FIG. 13 illustrates a display like that of FIG. 11 with a photovoltaic cell formed in front of the display.

As shown in FIGS. 10 and 11, a PV cell 110 may be formed in front of a display element 101. FIG. 13 therefore illustrates an embodiment of a PV-integrated display device 100 that includes a PV cell 110 over or in front of a display element 101 in the image region. In some embodiments, the PV active material is a blanket layer, and is left unpatterned. Advantageously, the PV cell 110 is oriented to be capable of receiving ambient light 102, display-generated light 104, or both. For example, the PV cell 110 may comprise a patterned or blanket transparent conductive material in electrical contact with the PV active material. Such a conductive layer may be in front of and/or behind the PV active material, and is transparent to allow the PV material to receive light 102, 104 in both directions. The PV cell 110 may also be oriented to be capable of receiving light by using opaque electrodes that are in electrical contact with the PV active material, but that are patterned to allow most light to transmit to the display 100 and/or the viewer.

Figure 14:
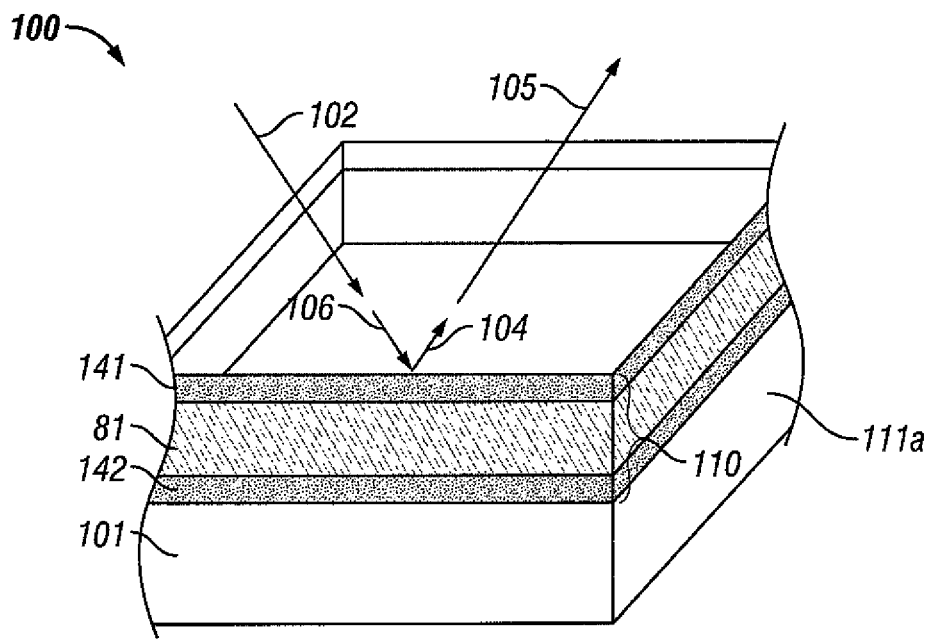
FIG. 14 illustrates a detailed view of a photovoltaic-integrated display similar to that of FIG. 13.

FIG. 14 depicts an enlarged view of one pixel 111a of FIG. 13, with the display element 101 shown under the front PV cell 110. As shown in FIG. 14, ambient light 102 is incident upon PV-integrated display device 100. Part of light 102 is absorbed within the PV active material 81, and generates electricity, while some light 106 transmits to the pixel 111a. In some embodiments, the pixel 111a may be a reflective pixel, such as an interferometric modulator. In such embodiments, light 106 incident upon the pixel 111a will either be absorbed (a darkened pixel), or, as illustrated, some of light 106 incident upon the pixel 111a may be reflected ("lit" pixel) (e.g., "open" versus "closed" interferometric modulator, as explained above in relation to FIG. 1). In embodiments where the pixel 111a is primarily reflective, any light 104 reflecting off of pixel 111a will then be partly absorbed by the PV material 81, while some light 105 is then transmitted to the viewer.

In embodiments where the pixel 111a is primarily reflective, the reflected light 104, 105 will contribute to the image displayed by the display device 110. In embodiments where the pixel 111a is not reflective, any reflected light 104, 105 may degrade the image and contribute to glare. In some embodiments, other layers may be formed over the PV cell 110, such as an antireflective coating or a passivation layer. Other layers serving various optical, electrical, or mechanical functions may also be formed over the PV cell 110.

As illustrated in FIG. 14, the PV active material 81 may be sandwiched between two layers of a transparent conductive material 141, 142 that can serve to improve contact to front and back electrodes for connecting the PV cell 110 or 120 in a circuit. It will be understood that the PV active material 81 may be configured to be in electrical contact with only one layer of a transparent conducting material. The transparent conductive layers 141, 142 allow the PV active material 81, and the PV cell 110 generally, to be capable, configured, or oriented to receive light from the front or back side of the PV cell 110. As illustrated in FIG. 14, the transparent conductive layers 141, 142 allow incident ambient light 102 to reach the photovoltaic active material 81 as well as the display element 101. The transparent conductive layers 141, 142 also allow some light 105 from a reflection 104 from the display to pass to a viewer. In embodiments where the display element 101 emits or generates light, such as in an emissive or transmissive display, the transparent conductive layers 141, 142 would allow display-generated light to reach the viewer. In other embodiments, the front PV cell 110 may comprise opaque electrodes in place of or in electrical contact with transparent conductive layers 141, 142. In these embodiments, the front PV cell 110 is oriented to receive light from the front and/or back side of the PV cell 100 by appropriately patterning the opaque electrode to provide adequately sized openings on the front or back side so that light rays 102 and 104 may be received by the front PV cell 110. A portion of the light received by the front PV cell 110 is absorbed and a portion of light 106, 105 is transmitted.

Figure 15:
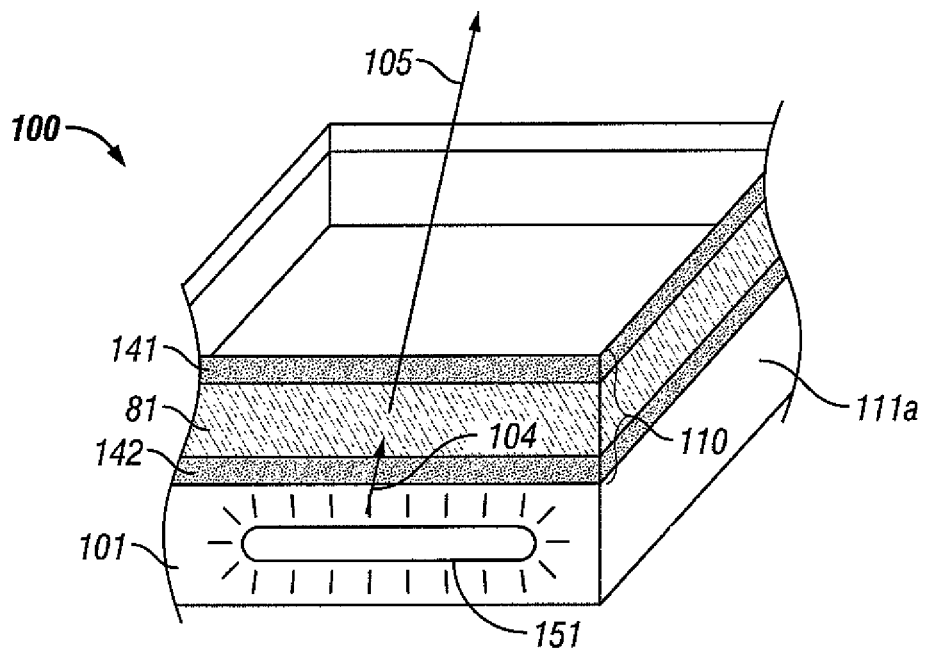
FIG. 15 illustrates a display like that of FIG. 14, where the display also includes a light source.

FIG. 15 illustrates an embodiment of PV-integrated display device 100, wherein the front PV cell 110 is placed or formed in front of the display. As shown in FIG. 15, the display element 101 may comprise a light source 151. The light source 151 may be a backlight configured to provide light from behind an active pixel such as an LCD pixel. The backlight may, therefore, be formed in the back of or behind the array of active pixels. Alternatively, the light source 151 may comprise the pixel itself. For example, a display may be made up of an array of LED pixels wherein the LEDs generate light. In such an embodiment, the individual pixels may serve as the light source 151. As shown in FIG. 15, the front PV cell 110 is oriented to be capable of receiving light 104 emitted by the display element 101, such as light 104 emitted by light source 151. The front PV cell 110 may be capable of receiving light 104 emitted by the display element 101 by using transparent conductors or patterned opaque electrodes as discussed above. The illustrated front PV cell 110 may capture and convert display-generated light 104 and ambient light 102 to electricity. As mentioned previously, the loss in transmission to the viewer of display-generated light 104 due to absorption at the front PV cell 110 may be a worthwhile tradeoff in many cases. For example, in outdoor display or mobile device applications, the PV-integrated display 100 may be expected to receive considerable incident ambient light. The amount of electricity generated from incident ambient light may be significant, while the front PV cell 110 may be configured to be transmissive enough that sufficient display-generated light 105 reaches the viewer.

The transparent conductive layers 141, 142 may comprise any transparent, conducting material. Many transparent conducting materials are transparent conducting oxides (TCO). TCO layers are often used with photovoltaic materials, particularly thin film photovoltaic materials, in order to improve electrode contact to the PV material without blocking light. Functionally the TCO may electrically form a part of front or back electrodes, which typically comprise opaque metallic or conducting electrodes in electrical contact with the TCO material. In display applications, the opaque electrodes may be patterned to form large windows where the PV material can capture significant light. Alternatively, electrodes may make contact with the transparent conducting material outside of the image display region altogether. As known to those with skill in the art, a common TCO is indium tin oxide (ITO). Methods of forming or depositing ITO are well known in the art and include electron beam evaporation, physical vapor deposition, or sputter deposition techniques. Other TCO materials and processes of manufacture may also be used. The TCO layer can be omitted in other embodiments.

Generally speaking, PV cells 110 formed in front of a display 100 may comprise thin film photovoltaic materials, as described above. Some advantages of thin film PV cells are small device footprint and scalability of the manufacturing process. In applications where the PV cell 110 is disposed in front of the display 100, thin film PV cells may be designed to be partially transmissive. In embodiments where the PV cell is placed in front of the display, the transmittance is desirably high enough for the display image to remain good, yet high transmittance reduces the efficiency of the PV cell. To keep high image quality in the display while still obtaining desired power generation, the transmittance of the PV cell can be, e.g., greater than 65%. In one embodiment, the transmittance is desirably between 65% and 85%, and preferably between about 70% and 80%. Using the principles of interferometric design, it is possible to design an interferometrically enhanced PV stack or cell (see FIG. 9B and attendant discussion) that has more absorption for incident light 102 than for light 104 that is transmitted, emitted, or reflected. This is because the principles of interferometry work differently depending on whether the light is incident from the front or back of the interferometrically enhanced PV stack or cell.

Figure 16:
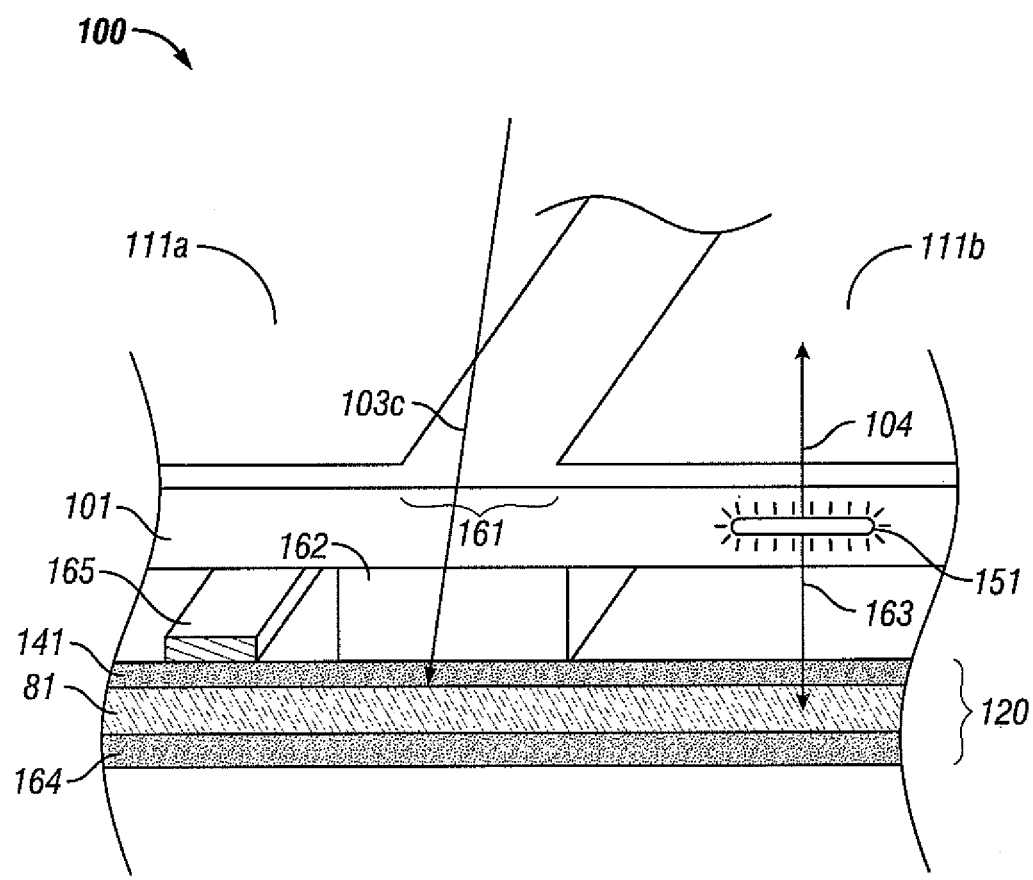
FIG. 16 illustrates a detailed view of a display like that of FIG. 12 with a photovoltaic cell formed behind or in the back of the display.

FIG. 16 illustrates another embodiment of a PV-integrated display device 100, where the PV cell 120 is formed over the back side of the display in the image region 121 (see FIG. 12). As shown in FIG. 16, a PV cell 120 may be advantageously placed behind a display element 101 because many displays have spaces or gaps 161 between active pixels which may transmit incident ambient light 103c through toward the back of the display 100. Therefore, in some embodiments, display 100 may comprise gaps 161 or other structures between the active pixels 111a, 111b capable of allowing ambient light 103c to reach the back PV cell 120 and the PV material 81. The display 100 may also comprise inactive structures 162 within the image region 121 that are at least partially transparent and capable of allowing ambient light 103c to reach the PV active material 81. In the illustrated embodiment, the inactive structure 162 is a support formed within inactive regions of the pixel array or image region of the display element 101. Exemplary transparent materials may comprise dielectrics such as silicon dioxide ($SiO_2$), titanium dioxide ($TiO_2$), magnesium fluoride ($MgF_2$), chromium (III) oxide ($Cr_3O_2$), silicon nitride ($Si_3N_4$), etc. However, any transparent or partially transparent material may be used for the inactive structures 162.

The display element 101 of FIG. 16 may also comprise a light source 151, with the PV cell 120 oriented and configured to be capable of receiving and converting to electricity light 163 from the light source 151. The back PV cell 120 may be capable of receiving light 163 emitted by the light source 151 by using transparent conductors or patterned opaque electrodes as discussed above. Hence the PV cell 120 may help recapture energy from display-generated light 163 that is not directed toward the viewer to generate the display image, and would therefore otherwise be wasted. The light source 151 may be a backlight, a light-emissive pixel or a front light to illustrate reflective pixels.

As illustrated in FIG. 16, the back PV cell 120 may comprise an opaque electrode 164 formed behind the PV active material 81. However, in some applications, light may be incident on the display from both a front and a back side. For example, another display may be formed or disposed opposite the back PV cell 120 from the illustrated display element 101. In such an embodiment, the back PV cell 120 may be sandwiched between two displays, and hence, opaque electrode 164 may be replaced by a transparent conducting material (as in 142 in FIG. 15). Additionally, opaque electrodes 165 may be formed over the transparent conducting layer 141. To maximize exposure of back PV cell 120 surface to light, however, the PV cell is configured or oriented such that electrode 165 is preferentially patterned only to cover regions where little or relatively less light is expected to transmit through the display element 101 in order to allow the majority of light transmitting through the display to reach the PV active material 81.

Figure 17:
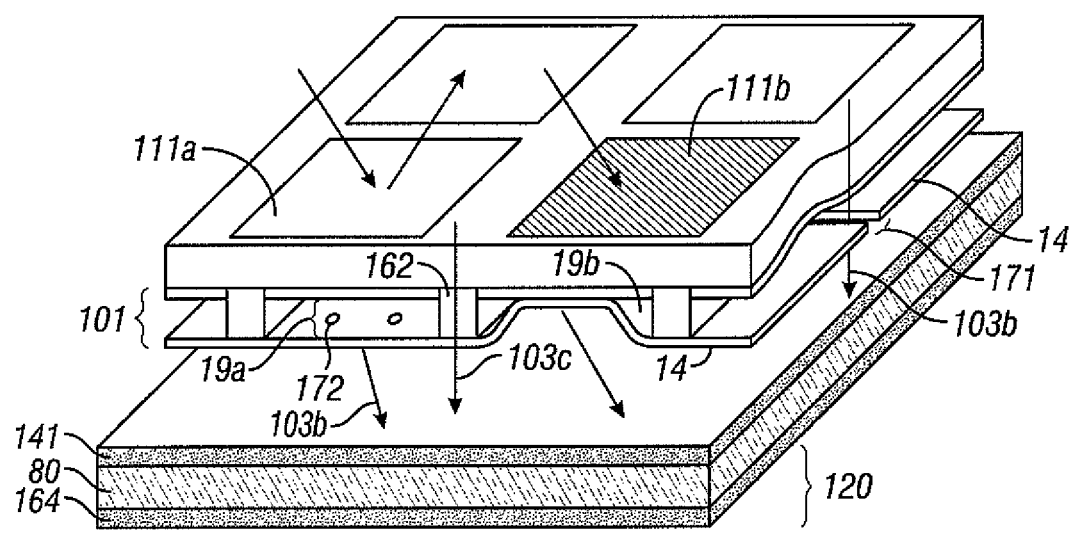
FIG. 17 illustrates a detailed view of multiple interferometric modulator pixels in an array with a photovoltaic cell formed behind the display.

FIG. 17 illustrates an embodiment of a PV-integrated display 100 similar to that of FIG. 16, wherein the display material 101 comprises interferometric modulators. In some embodiments, the interferometric modulator is primarily reflective. However, even a primarily reflective display will transmit some appreciable light to the back of the display. Hence, a PV cell 120 may be placed behind the display element 101 to capture this light. Ambient light 103c may reach the PV cell 120 through inactive structures 162, such as posts, pillars, rails (see, e.g., 18, 42 in FIGS. 7A-7E) or other structures that are made out of transparent or semi-transparent material, as well as voids or gaps. In an embodiment with an array of interferometric modulator pixels, the display element 101 may also include a space or a gap 171 between rows or columns of reflector layers 14. These gaps may also be capable of transmitting light 103b through to the PV cell 120 below.

As explained previously, an interferometric modulator pixel may comprise an optical absorber (formed within the optical stack 16 of FIG. 1), a reflector 14, and a variable optical cavity or vertical gap 19. However, even the reflector 14 or reflective layer may allow some light to transmit to a PV cell 120 disposed behind the display element 101. For example, the reflector 14 may comprise small holes 172 that allow light to pass through. Small holes 172 may be useful in the manufacturing process (e.g., allowing etch gases to access sacrificial material while "releasing" the MEMS and may have little impact on the image generated by the display). Small holes 172 may also help allow the reflective membrane 14 or mirror to easily move from actuated to relaxed states (as shown in FIG. 1) by allowing air to pass as reflector 14 moves up or down. Placing a PV cell 120 behind the display takes advantage of these holes 172, as well as inactive structures 162 mentioned previously, to capture light and generate electricity with it.

In addition, the interferometric modulator pixel may be configured or designed to be partially transmissive and the active pixels may therefore be designed to be capable of allowing considerable ambient light to pass through and reach the PV cell 120 and its PV active material 81. In general, the reflector 14 may, for example, comprise a metal layer, such as aluminum (Al), molybdenum (Mo), zirconium (Zr), tungsten (W), iron (Fe), gold (Au), silver (Ag), and chromium (Cr) or an alloy of the foregoing, such as MoCr. The reflector 14 is typically thick enough to be opaque (e.g., 300 nm or more). However, in other embodiments, the reflector 14 is a partial reflector for a "transflective" IMOD display. The transmissivity of the reflector 14 in certain embodiments is dependent on the thickness of the reflector 14. Generally, a metallic reflector 14 that is a partial reflector will be between 20 and 300 Å, preferably less than 225 Å. By using thin semireflective layers in the reflectors 14 in various embodiments of a PV-integrated display 100, the interferometric modulator may be configured to allow from about 5% to about 50% to pass through the active array of display pixels to reach the photovoltaic material.

The various embodiments disclosed herein may be manufactured in different ways. For example, a display comprising an array of active pixels in an image region may be integrated with a PV cell by lamination of one of the PV cell and the display onto the other. Alternatively, for a PV cell disposed behind a display, the PV cell may formed, e.g., laminated or deposited, on a backplate that may be metallic or transparent, depending upon the application. The backplate may then be attached to the display to form the rear surface of the display device. In other embodiments where the PV cell is disposed in front of the display, the PV cell may be formed on a transparent coverplate, such as glass or plastic. The coverplate may then be attached or laminated onto the display, or the display may then be formed or deposited on one or the other side of the coverplate.

In other embodiments, the display and the PV cell may be formed on opposite sides of the same substrate using various deposition techniques known to those of skill in the art. For example, a glass substrate may be used as a substrate to form a display (e.g., substrate 20 in FIGS. 1 and 7A-7E) on one side of the substrate. The PV cell may also be formed on the other side of the substrate. For example, the PV cell may be deposited first on one side, and the display may then be deposited on the opposite side. As will be understood by one of skill in the art, the deposition of the PV cell and the display may be accomplished in various embodiments to allow the PV cell to be disposed in front of or behind the display.

While the foregoing detailed description discloses several embodiments of the invention, it should be understood that this disclosure is illustrative only and is not limiting of the invention. It should be appreciated that the specific configurations and operations disclosed can differ from those described above, and that the methods described herein can be used in contexts other than fabrication of semiconductor devices. The skilled artisan will appreciate that certain features described with respect to one embodiment may also be applicable to other embodiments. For example, various features of an interferometric stack have been discussed with respect to the front side of a photovoltaic cell, device or array, and such features are readily applicable to an interferometric stack formed over a back side of a photovoltaic cell, device or array. For example, various reflector features have been discussed with respect to various embodiments of interferometric modulators formed over a front side of a PV device. Such reflector features are also applicable to interferometric modulators formed over a back side of a PV device, including the use of partial reflectors, or the omission of a reflector while using the back electrodes as a reflector for some embodiments of an interferometric modulator.

We claim:

1. A display device configured to display an image toward a front side, with a back side opposite the front side, the display device comprising:
   a transparent substrate having a front side and a back side;
   a display comprising an array of addressable pixels in an image region of the display, the addressable pixels being formed on a back side of the substrate, wherein array of addressable pixels includes interferometric modulators; and
   a photovoltaic cell comprising a blanket layer of photovoltaic material formed on a front side of the substrate, wherein the blanket layer is disposed in front of the addressable pixels in the image region.

2. The display device of claim 1, wherein each interferometric modulator includes an optical absorber, a reflector, and a variable gap between the absorber and the reflector.

3. The display device of claim 1, wherein the photovoltaic material comprises a deposited thin film photovoltaic material.

4. The display device of claim 1, wherein the photovoltaic cell is capable of receiving and converting to electricity both ambient light as well as light generated by the display.

5. The display device of claim 4, wherein the addressable pixels further include one or more of light-emissive pixels, LCD pixels, and reflective pixels.

6. The display device of claim 1, wherein the photovoltaic cell comprises a transparent conducting film in electrical contact with the photovoltaic material on the front side and back side of the photovoltaic material.

7. The display device of claim 6, wherein the photovoltaic material has a transmittance of greater than 65% of visible light incident on the photovoltaic material.

8. The display device of claim 6, wherein the photovoltaic material has a transmittance between about 70% and 80%.

9. A display device configured to display an image toward a front side, with a back side opposite the front side, the display device comprising:
   a transparent substrate;
   a display comprising an array of addressable interferometric modulator pixels in an image region, the display being formed on the back side of the substrate; and
   a photovoltaic cell comprising a photovoltaic material formed over the front side of the interferometric modulator pixels in the image region, wherein the photovoltaic material is a blanket layer.

10. The display device of claim 9, wherein each interferometric modulator pixel includes an optical absorber, a reflector, and a variable gap between the absorber and the reflector.

11. The display device of claim 9, wherein the photovoltaic material comprises a deposited thin film photovoltaic material.

12. A method of manufacturing a display device, the display device capable of displaying an image toward a front side, with a back side opposite the front side, the method comprising:
   forming a display comprising an array of addressable pixels in an image region on a transparent substrate, wherein the array is formed on the back side of the substrate and the array of addressable pixels includes interferometric modulators; and
   disposing a blanket photovoltaic material on the front side of the substrate over the front side of the display in the image region.

13. The method of claim 12, wherein disposing a blanket photovoltaic material on the front side of the substrate comprises depositing a thin film photovoltaic material on the front side of the substrate.

14. The method of claim 12, wherein disposing a blanket photovoltaic material on the front side of the substrate comprises laminating one of a photovoltaic cell and the display onto the other.

15. The method of claim 12, further comprising disposing a blanket photovoltaic material over the back side of the display.

16. The method of claim 12, further comprising depositing a transparent conducting oxide on the front side and the back side of the photovoltaic material.

* * * * *

UNITED STATES PATENT AND TRADEMARK OFFICE
CERTIFICATE OF CORRECTION

| | |
|---|---|
| PATENT NO. | : 8,797,628 B2 |
| APPLICATION NO. | : 12/842845 |
| DATED | : August 5, 2014 |
| INVENTOR(S) | : Manish Kothari |

It is certified that error appears in the above-identified patent and that said Letters Patent is hereby corrected as shown below:

Title Page

Page 1 (item 73) line 1, Change "Qualcomm Memstechnologies, Inc.," to --Qualcomm MEMS Technologies, Inc.,--.

In column 2 (page 5, item 56) line 5, References Cited Under Other Publications, Change "Grundiagen" to --Grundlagen--.

In the Specification

In column 12 line 19, Change "(a-silicon)," to --($\alpha$-silicon),--.

Signed and Sealed this
Tenth Day of March, 2015

Michelle K. Lee
*Deputy Director of the United States Patent and Trademark Office*